US008878115B2

(12) United States Patent
Shimotsusa et al.

(10) Patent No.: US 8,878,115 B2
(45) Date of Patent: Nov. 4, 2014

(54) PHOTOELECTRIC CONVERSION ELEMENT, AND PHOTOELECTRIC CONVERSION APPARATUS AND IMAGING SYSTEM HAVING A LIGHT GUIDE

(75) Inventors: Mineo Shimotsusa, Machida (JP); Taro Kato, Kawasaki (JP); Yasuhiro Sekine, Yokohama (JP); Mahito Shinohara, Tokyo (JP); Takeshi Ichikawa, Hachioji (JP); Genzo Momma, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 353 days.

(21) Appl. No.: 13/364,041

(22) Filed: Feb. 1, 2012

(65) Prior Publication Data

US 2012/0199725 A1  Aug. 9, 2012

(30) Foreign Application Priority Data

Feb. 9, 2011  (JP) ................. 2011-026343
Oct. 7, 2011  (JP) ................. 2011-223304

(51) Int. Cl.
*H01L 27/00* (2006.01)
*H01L 27/146* (2006.01)
(52) U.S. Cl.
CPC .... *H01L 27/14629* (2013.01); *H01L 27/14627* (2013.01)
USPC .................................. 250/208.1
(58) Field of Classification Search
USPC ........ 250/208.1, 216; 348/340; 257/294, 432; 438/65; 359/619
See application file for complete search history.

(56) References Cited

U.S. PATENT DOCUMENTS

| 5,463,216 A | 10/1995 | Van Berkel |
| 5,466,926 A | 11/1995 | Sasano |
| 6,246,081 B1 | 6/2001 | Abe |
| 6,816,199 B1 | 11/2004 | Ide |
| 7,615,732 B2 * | 11/2009 | Tani ............................. 250/216 |
| 2005/0242271 A1 * | 11/2005 | Weng et al. ................ 250/214.1 |
| 2006/0113620 A1 | 6/2006 | Park |
| 2008/0303108 A1 * | 12/2008 | Kasano et al. ................ 257/432 |

FOREIGN PATENT DOCUMENTS

| CN | 1574371 A | 2/2005 |
| JP | 04-223371 A | 8/1992 |
| JP | 5-206429 A1 | 8/1993 |
| JP | 6-244391 A | 9/1994 |
| JP | 7-45805 A | 2/1995 |
| JP | 07-221277 A | 8/1995 |
| JP | 8-139300 A | 5/1996 |
| JP | 9-116914 A | 5/1997 |
| JP | 10-209409 A | 8/1998 |
| JP | 11-087674 A | 3/1999 |
| JP | 2000-338393 A | 12/2000 |
| JP | 2000-357786 A | 12/2000 |
| JP | 2002-118245 A | 4/2002 |
| JP | 2003-197886 A | 7/2003 |

(Continued)

*Primary Examiner* — Thanh Luu
(74) *Attorney, Agent, or Firm* — Canon USA, Inc. IP Division

(57) ABSTRACT

A light condensing member focuses light, which is incident upon a first area of the light condensing member corresponding to an opening portion of an insulation film, in an upper portion region of a light path member arranged within the opening portion, the insulation film having an upper face extending from the opening portion, and the light path member having a lower face in a region corresponding to a light receiving face of an photoelectric conversion portion.

20 Claims, 10 Drawing Sheets

(56) References Cited

FOREIGN PATENT DOCUMENTS

| | | |
|---|---|---|
| JP | 2003-249632 A | 9/2003 |
| JP | 2005-286034 A | 10/2005 |
| JP | 2006-120845 A | 5/2006 |
| JP | 2006-157004 A | 6/2006 |
| JP | 2007-305690 A | 11/2007 |
| JP | 2008-071972 A | 3/2008 |
| JP | 2008-166677 A | 7/2008 |
| JP | 2008-177221 A | 7/2008 |
| JP | 2008-218650 A | 9/2008 |
| JP | 2010123745 A | 6/2010 |
| JP | 2010-205952 A | 9/2010 |

\* cited by examiner

PHOTOELECTRIC CONVERSION ELEMENT, AND PHOTOELECTRIC CONVERSION APPARATUS AND IMAGING SYSTEM HAVING A LIGHT GUIDE

BACKGROUND OF THE INVENTION

1. Field of the Invention

The present invention relates to a photoelectric conversion element having a light guide.

2. Description of the Related Art

With a photoelectric conversion apparatus having photoelectric converting portions, reduction in such as the pitch of the photoelectric converting portions and the area of light receiving faces, is necessary to increase the number of photoelectric converting portions and/or to miniaturize the photoelectric conversion apparatus. Therefore, by increasing the usage efficiency of incident light, the sensitivity of the photoelectric converting apparatus can be improved.

In order to increase usage efficiency of incident light, as disclosed in Japanese Patent Laid-Open No. 07-045805, Japanese Patent Laid-Open No. 2002-118245, and Japanese Patent Laid-Open No. 2008-218650, providing a light guide (light path member) on a light receiving surface of a light receiving portion (photoelectric converting portion), and forming a micro-lens on the upper portion of the light guide is effective.

Japanese Patent Laid-Open No. 07-045805 discloses a focal point of the micro-lens being positioned in the vicinity of an incident face of the light guide. Japanese Patent Laid-Open No. 2002-118245 discloses a focal point of the micro-lens being positioned in the vicinity of a light receiving face. Japanese Patent Laid-Open No. 2008-218650 discloses a focal point of the light input from a region in the vicinity of the optical axis of the micro-lens being positioned in the vicinity of an emitting face of the light guide, and a focal point of the light input from the region in the vicinity of the periphery of the micro-lens being positioned in the vicinity of the incident face of the light guide.

SUMMARY OF THE INVENTION

The present invention provides a photoelectric conversion element comprising: a photoelectric conversion portion; a light path member arranged within an opening portion of an insulation film, the insulation film having an upper face extending from the opening portion, and the light path member having a lower face in a region corresponding to a light receiving face of the photoelectric conversion portion; and a condensing member including at least one light condensing lens body layer; wherein the light receiving face is positioned in a first plane and the upper face is positioned in a second plane, the second plane being parallel to the first plane and being away from the first plane by a distance T; and wherein the lower face is positioned in a third plane, the third plane being parallel to the first plane and being away from the second plane toward the light receiving face side by a distance D, the distance D being equal to or smaller than the distance T; and wherein the light condensing member focuses light, which is incident upon a first area of the light condensing member corresponding to the opening portion, in a region within the light path member, and the region being between the second plane and a fourth plane, the fourth plane being parallel to the first plane and being away from the second plane toward the light receiving face side by a distance D/2.

Further features of the present invention will become apparent from the following description of exemplary embodiments with reference to the attached drawings.

DESCRIPTION OF THE EMBODIMENTS

Figure 1:
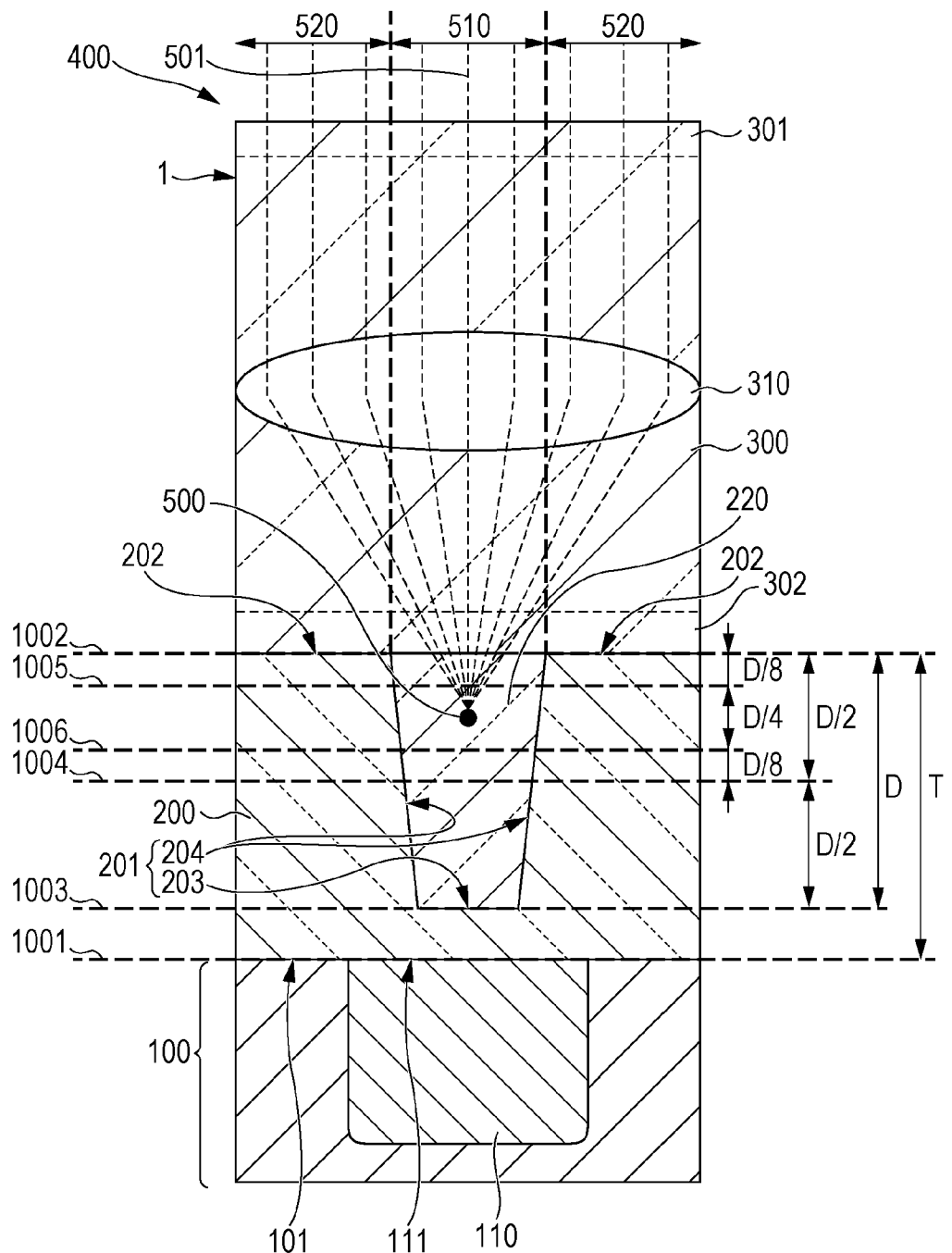
FIG. 1 is a cross-sectional schematic diagram describing the present invention.

The present invention will be described below with reference to the appended diagrams. FIG. 1 is a schematic cross-sectional diagram of a photoelectric conversion element 1, illustrating the concept of the present invention.

The photoelectric conversion element 1 has a photoelectric conversion portion 110. A photoelectric conversion apparatus can be formed by arraying multiple (many) photoelectric conversion elements 1 in a one-dimensional form or two-dimensional form. The photoelectric conversion apparatus will be described later with reference to FIG. 9, and may further include a peripheral path, unshown, for controlling signals obtained from the photoelectric conversion elements 1.

The photoelectric conversion portion 110 is provided on a substrate 100. With the photoelectric conversion apparatus, one substrate 100 has multiple photoelectric conversion portions 110, and each multiple photoelectric conversion portions 110 forms a portion of an individual photoelectric conversion element 1.

A face on the upper side of the diagram of the photoelectric conversion portion 110 is a light receiving face 111. We will refer to an imaginary (geometric) plane including the light receiving face 111 as a first plane 1001. Typically, the photoelectric conversion portion 110 is formed by introduction an impurity into a portion of the semiconductor substrate 100 that is deeper than a main face 101. Therefore, typically the light receiving face 111 of the photoelectric conversion portion 110 substantially matches at least a portion of the main face 101 of the substrate 100, and the first plane 1001 includes the main face 101 of the substrate 100.

However, the photoelectric conversion portion 110 may have a recessed portion provided in the main face 101 of the semiconductor substrate 100 and may be formed in a portion deeper than the floor face of the recessed portion. Alternatively, the photoelectric conversion portion 110 may be formed as a MIS-type configuration or a thin film having a PIN-type configuration on the main face of a glass plate or the like. In such cases, the main face 101 of the substrate 100 and the light receiving face 111 of the photoelectric conversion portion 110 do not necessarily exist on the same plane.

An insulating layer 200 that covers at least one main face 101, on which photoelectric conversion portions of the substrate 100 are arrayed, is provided on the substrate 100 (on the main face 101). Specifically, the insulating layer 200 covers the main face 101 of the substrate 100 and the light receiving face 111 of the photoelectric conversion portion 110. That is to say, the lower face of the insulating layer 200 is in contact with the main face 101 of the substrate 100 and the light receiving face 111. The insulating layer 200 has insulation such that multiple photoelectric conversion portions 110 do not conduct therebetween (a conduction rate lower than the conduction rate of the substrate 100). Typically, the insulating layer 200 is transparent. The insulating layer 200 may be a monolayer film made of one type of material, but the insulating layer 200 typically is a multi-layer film made of multiple layers. The multi-layer film will be described later.

The insulating layer 200 has an opening portion 201 (hole portion). The opening portion 201 may be a through hole or a recessed portion, but FIG. 1 shows a configuration in the case of the opening portion 201 being a recessed portion. The insulating layer 200 has an upper face 202 that is substantially flat and parallel to the main face 101 of the substrate 100. We will refer to an imaginary (geometric) plane including the upper face 202 as a second plane 1002. The second plane 1002 is parallel to the first plane 1001, and the first plane 1001 and second plane 1002 are separated by the distance T. The distance T substantially matches the thickness of the insulating layer 200. The opening portion 201 continues to the upper face 202. Specifically, the opening portion 201 is made up of a floor face 203 and a side face 204. An imaginary (geometric) plane including the floor face 203 is called a third plane 1003. The floor face 203 is positioned in a region corresponding to the light receiving face 111. Specifically, the floor face 203 is positioned in a direction parallel to the main face 101 (in a direction parallel to the first plane 1001 and third plane 1001), so as to be in line with orthogonal projection from the light receiving face 111. Thus, the light receiving face 111 and floor face 203 face one another via a portion of the insulating film 200. The third plane 1003 is parallel to the second plane 1002 (and the first plane 1002), and the second plane 1002 and third plane 1003 are separated by a distance D. Distance D substantially matches the depth of the opening portion 201. The side face 204 continues to the upper face 202 and floor face 203. Therefore, the side face 204 substantially is extended between the second plane 1002 and third plane 1003. Note that there may be cases wherein a cross-sectional form of the opening portion 201 is in a U shape, and the boundary between the floor face 203 and side face 204 are not actually clear. The third plane 1003 is, at the least, determined so as to include a point nearest the substrate 100 (the floor of the opening portion 201) on a surface on the opposite side from the side of the substrate 100 of the insulating layer 200. As described above, "the surface on the opposite side from the substrate 100 of the insulation layer 200" has an upper face 202, floor face 203, and side face 204. The surface of the substrate 100 side of the insulation layer 200 is the lower face of the insulation layer 200. As is clear from the description up to this point, first plane 1001 and third plane 1003 are separated by a distance T–D (>0). Note that in the case of the opening portion 201 being a through hole instead of a recessed portion, the light receiving face 111 forms the floor face of the opening portion. The depth of the opening portion 201 is substantially the same as the thickness of the insulation layer 200, whereby T=D holds.

Now, a fourth plane 1004 will be defined, as an imaginary (geometric) plane that is positioned between the second plane 1002 and third plane 1003. The fourth plane 1004 is separated from the second plane 1002 toward the light receiving face 111 side by distance D/2, and is separated from the third plane 1003 toward the light receiving face 111 side by distance (D/2). Accordingly, the fourth plane 1004 is separated from the first plane 1001 by distance T−(D/2).

The distance D (depth of opening portion 201) is preferably at ¼ or greater of the distance T (thickness of the insulation layer 200), and more preferably ½ or greater of the distance T. Also, the distance D is preferably longer than the wavelength of the incident light. The typical incident light wavelength is preferably the 0.55 μm of green, with the distance D at 0.55 μm or greater. Accordingly, the thickness of the insulation layer 200 is preferably thicker than 0.55 μm, and more preferably greater than 1.0 μm. When the insulation layer 200 is significantly thicker, stress increases and manufacturing time increases, whereby for practicality, the thickness $T_f$ of the insulation layer 200 is set to be 10 μm or less, and preferably 5.0 μm or less.

The width (diameter) of the opening edge of the opening portion 201 (the side face 204 within the second plane 1002) is typically 10 μm or less, and preferably 5.0 μm or less. In the case that the width of the opening edge is 2.0 μm or less, the present invention provides a particularly significant advantage.

Also, a fifth plane 1005 and a sixth plane 1006 will be defined as imaginary (geometric) planes that are positioned between the second plane 1002 and the fourth plane 1004. The fifth plane 1005 is separated from the second plane 1002 toward the light receiving face 111 side by distance D/8. The sixth plane 1006 is separated from the fourth plane 1004 toward the second plane 1002 side by distance D/8. Accordingly, the sixth plane 1006 is separated from the fifth plane 1005 by distance D/4.

A light path member 220 is positioned within the opening portion 201. The light path member 220 is transparent. Note that "transparency" as used here means substantially having a certain level of transparency as to the light of a wavelength band regarding which photoelectric conversion is to be performed, and may have wavelength selectivity. The refractive index of the light path member 220 is preferably higher than the refractive index of the insulation layer 200. However, the refractive index of a portion of the light path member 220 may be lower than the refractive index of the insulation layer 200. Note that in the case that a refractive index is simply mentioned in relation to the present invention, this means an absolute refractive index. While the refractive index differs according to the wavelength, this is at least the refractive index as to the wavelength of light that can generate a signal charge with the photoelectric converting portion 110. Further, in the case that the photoelectric conversion element 1 has a wavelength selecting layer such as a color filter or the like, a wavelength of light that has passed through the wavelength selecting layer is used. However, in practical use, the wavelength of the incident light may be deemed to be 0.55 μm, which is the wavelength of green to which the human eye is sensitive, and in the description below, a refractive index corresponding to 0.55 μm will be described.

The shape of the light path member 220 roughly matches the shape of the opening portion 201 in a substantial manner. According to the present embodiment, the light path member 220 has a truncated cone shape, but according to the shape of the opening portion 201, the light path member 220 may be a truncated pyramid shape, a square column shape, or a cylindrical shape. The light path member 220 has preferably a rotational symmetry as to the central axis. The width (diameter) of the light path member 220 is typically 10 μm or less, and is preferably 5.0 μm or less. In the case that the width of the opening edge is 2.0 μm or less, the present invention has a particularly significant advantage.

The light path member 220 is in contact with the floor face 203 of the opening portion 201. Note that in the case that the opening portion is a through hole, the light path member 220 is in contact with the light receiving face 111 of the photoelectric conversion portion 110. The face that is in contact with the opening portion 201 of the light path member 220 is called a lower face. The light input to the light path member 220 is emitted from the lower face of the light path member 220 toward the photoelectric conversion portion 110. Accordingly, the lower face of the light path member 220 can also be called an emitting face. The lower face of the light path member 220 forms an interface with the floor face 203, and the lower face of the light path member 220 is positioned substantially within the same plane (third plane 1003) as the floor face 203. Accordingly, the diagram only shows the floor face 203 instead of the lower face. There are cases wherein, upon the light path member 220 in contact with the light receiving face 111 of the photoelectric conversion portion 110 (T=D), noise readily occurs in the photoelectric conversion portion 110, and accordingly preferably T>D holds so the light path member 220 is not in contact with the photoelectric conversion portion 110.

The light path member 220 is preferably surrounded by the side face 204 of the opening portion 201. In the case that the refractive index of the light path member 220 is greater than the refractive index of the insulation layer 200, and the light path member 220 and insulation layer 200 form an interface, geometric optical total reflection occurs at the interface, and the incident light can be guided into the light path member 220 and consequently guided to the light receiving face 111. Also, in the case of providing a film which is opaque as compared to the light path member 220 between the light path member 220 and side face 204, the refractive index of the light path member 220 may be equivalent to or lower than the refractive index of the insulation layer 200. Providing an opaque film can reduce the amount of light that leaks out from the side face 204, which is a cause of stray light. Further, if the opaque film is a film having metallic luster, (metallic film or the like), metallic reflection occurs at the opaque film, and the incident light can be guided into the light path member 220 and consequently guided to the light receiving face 111. Note that as a matter of course, the opaque film does not cover at least a portion of the floor face 203, and the floor face 203 and light path member 220 should be in contact. Upon the opaque film being positioned between the light path member 220 and side face 204, the light that is not input to the light path member 220 but is input to the insulation layer 200 is not input to the light path member 220. On the other hand, if the light path member 220 is in contact with the side face 204 of the insulation layer 200 without an opaque film being provided, the light incident in the insulation layer 200 can be incident from the insulation layer 200 into the light path member 220. Therefore, rather than provide an opaque film, the light path member 220 is preferably in contact with the side face 204.

As described above, at least the light path member 220 and insulation layer 200 form a light guide configuration, and the light path member 220 has a function serving as a light path of a light guide configuration.

The material (transparent material) of the light path member 220 may be an organic material (resin), but inorganic materials are chemically stable and thereby are preferable. Silicon nitride ($Si_3N_4$), silicon oxynitride ($SiO_xN_y$), silicon oxide ($SiO_2$), and titanium oxide ($TiO_2$) are preferable as inorganic material, and particularly silicon oxynitride and silicon nitride are preferable. The light path member 220 may be made up of multiple materials, and the light path member 220 may have a refractive index distribution. In practice, the refractive index of the light path member 220 is preferably 1.6 or greater. Also, "transparent" may mean to may have substantially sufficient light transparency regarding the light of the wavelength band regarding which photoelectric conversion is performed.

The photoelectric conversion element 1 has a light condensing member 300 on the side opposite from the light receiving face 111 side of the second plane 1002. FIG. 1 shows a light condensing function 310 of the light condensing member 300 schematically, using a biconvex lens shape. Though details will be described later, the light condensing member 300 includes at least one light condensing lens body layer. Typically, the light condensing member is a layered member made up of multiple layers. The layer 301 which is a portion of the light condensing member 300 is a layer farthest removed from the light path member 220 (outermost layer), of the multiple layers of the light condensing member 300. The outermost layer 301 may have a light condensing function. The light condensing member 300 has an optical axis 501. FIG. 1 shows an example wherein the optical axis 501 is orthogonal to the first plane 1001, but may be inclined as to the first plane 1001.

The layer 302 which is a portion of the light condensing member 300 is the innermost layer of the light condensing member 300. The innermost layer 302 is in contact with the light path member 220. The innermost layer 302 may have a light condensing function. The material of the innermost layer 302 may be the same material as the light path member 220. In such a case, there are cases wherein the light path member 220 and the innermost layer 302 that are mutually made of the same transparent material are integrated, and the boundary between the light path member 220 and innermost layer 302 cannot be clearly observed. As described above, the light path member 220 is positioned on the inner side of the opening portion 201 (between the second plane 1002 and third plane 1003), and the innermost layer 302 exists on the outer side of the opening portion 201. Accordingly, by determining whether the transparent material exists on the inner side of the opening portion 201 or exists on the outer side of the opening portion 201, the light path member 220 and innermost layer 302 can be distinguished. The distinction between the inner side and outer side of the opening portion 201 can be made by virtually extending the upper face 202 of the insulation layer 200 to the top of the opening portion 201 in an observation image of a cross-section of the photoelectric conversion element 1 (the upper edges of the side face 204 are virtually linked together with a straight line).

Note that the "same material" means material having the same stoichiometric composition. Therefore, material differing from the stoichiometric composition (i.e. the nonstoichiometric composition differs), or material having different crystallization, material density, impurities (1 wt % or less) and the concentration thereof can also be seen as "same material". For example, the stoichiometric composition ratio of silicon nitride is Si:N=3:4, but in the range of having the same stoichiometric composition ratio, materials actually having different Si and N ratios can be seen as the same material. Note that materials having different stoichiometric composition are not the same material. For example, titanium monoxide (TiO) and titanium dioxide ($TiO_2$) both are compounds of oxygen and titanium (titanium oxide), but are materials that differ stoichiometrically.

The outermost layer 301 forms a interface with a medium 400 having a refractive index of 1.000 or greater and 1.001 or less. Substantially, the medium 400 is a gas such as air or nitrogen, or a vacuum. Note that the medium 400 is a separate unit from the photoelectric conversion element 1, and is not a portion of the photoelectric conversion element 1.

With the photoelectric conversion element 1, the incident light from the medium 400 to the light condensing member 300, parallel to the optical axis 501 of the light condensing member 300, is condensed substantially at one point. The point at which light is condensed at this point is a focal point 500. FIG. 1 shows the optical axis 501 with a broken line and a schematic light path of the incident light with a dotted line that is not labeled.

According to the present invention, the light condensing member 300 forms the focal point 500 within the light path member 220. Further, the focal point 500 is positioned in a region between the second plane 1002 and fourth plane 1004. The region of the opening portion 201 is positioned on the upper portion of the opening portion 201, and is therefore called an upper portion region. Note that the focal point 500 is not positioned in the second plane 1002 and in the fourth plane 1004.

Figure 2:
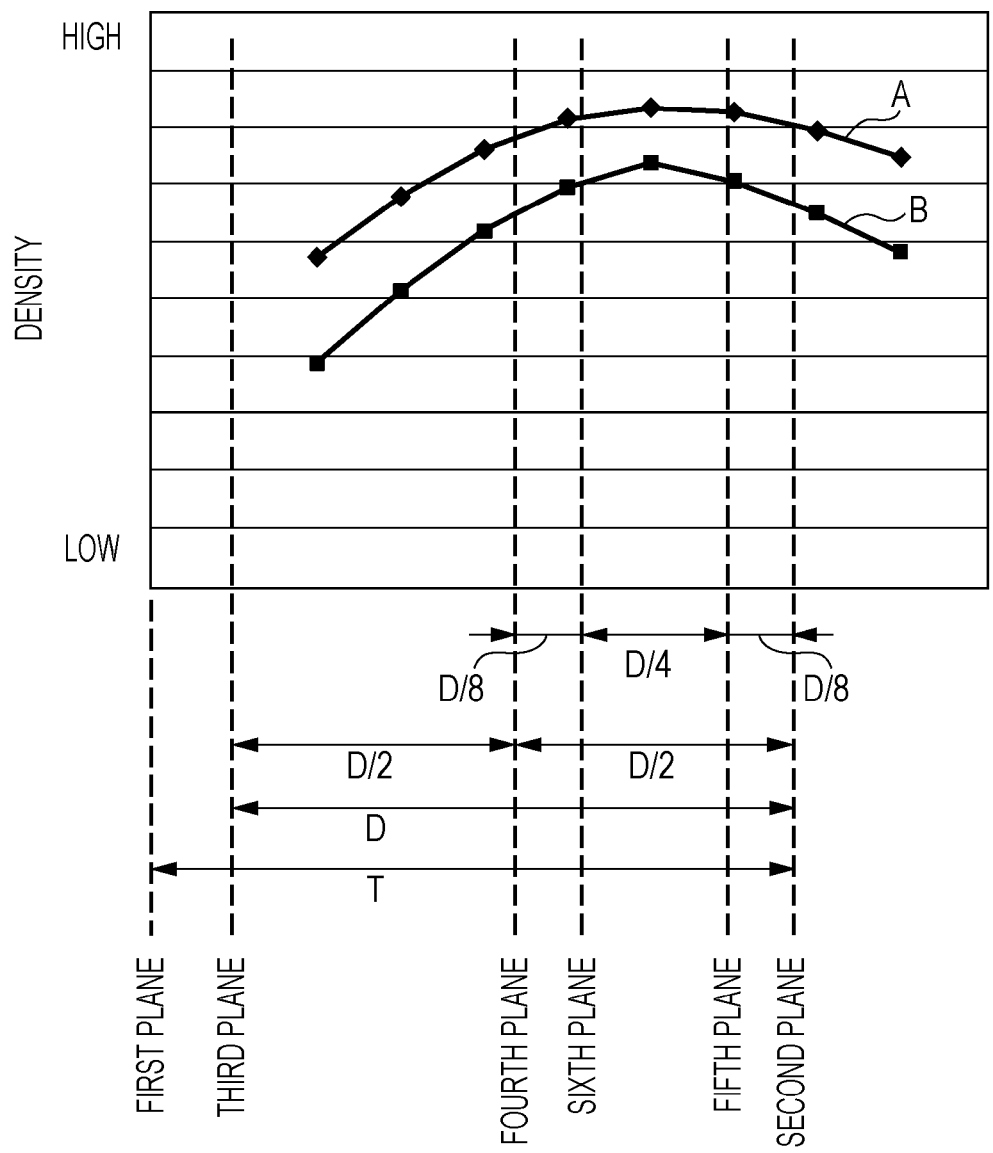
FIG. 2 is a schematic diagram describing the present invention.

FIG. 2 shows the result of finding the relation between the amount of signal charge generated with the photoelectric conversion portion and the position of the focal point 500 in the case of a constant incident light amount, by simulation. The position of the focal point 500 is changed by differing the configuration of the light condensing member 300. Also, line A and line B differ by the opening edge area (area of the region surrounded by the upper face 202) of the opening portion 201 in the second plane 1002, and the line B has a smaller opening edge area than line A. Therefore, the sensitivity of line B is lower than that of line A.

As can be understood from FIG. 2, when the focal point 500 is positioned in a region (upper portion region) between the second plane 1002 and fourth plane 1004, sensitivity is increased as compared to the case of being positioned outside the upper region.

This can be thought to be, due to the light being transported while refracting in a wave-optic manner rather than being linear (geometric optical). The refracted light becomes light that is not contained in the opening edge, i.e., enters the insulation layer 200 and becomes stray light, and can lead to loss. However, by positioning the focal point 500 between the second plane 1002 and fourth plane 1004, whereby the refracted light can be incident in the opening portion 201, and sensitivity can be presumed to increase. Such wave-optic refraction has a particularly great influence in the case that the width of the opening edge is 2.0 µm or less.

Further, the focal point 500 is preferably formed between the fifth plane 1005 and the fourth plane 1004, rather than to be formed between the second plane 1002 and the fifth plane 1005. This is because, upon the focal point 500 being positioned between the second plane 1002 and fifth plane 1005, in the case that light enters diagonally into the light condensing member 300, the possibility occurs that the focal point 500 is not formed in the light path member 220.

Also, as can be understood from the comparison of line A and line B, as the opening edge area decreases (line A->line B), the decrease in sensitivity in the case that the focal point 500 is farther from the region between the second plane 1002 and fourth plane 1004 becomes significant. Of the upper region, the focal point 500 is preferably positioned in a region between the fifth plane 1005 and sixth plane 1006 (upper middle region). When the focal point 500 is in the upper middle region, sensitivity is particularly increased. Further, even if differences in the opening edge areas themselves occur due to manufacturing error, for example, or if substantial differences in the opening edge areas occur due to shifting of the center of the opening edge and the optical axis 501, differences in sensitivity can be reduced.

As shown in FIG. 1, incident light to the outermost layer 301 of the light condensing member 300 includes incident light to the middle area 510 near the optical axis 501 of the outermost layer 301 and incident light to the periphery area 520 that is far from the optical axis 501. The middle area 510 is an area corresponding to the opening portion 201. Specifically, the middle area 510 is an area that is in line with orthogonal projection from the opening edge, in a direction parallel to the main face 101 (in the direction parallel the first plane 1001 and second plane 1002). On the other hand, the periphery area 520 is a region corresponding to the upper face 202. Specifically, this is an area that is in line with orthogonal projection from the upper face 202, in the direction parallel to the main face 101 (in the direction parallel to the first plane 1001 and second plane 1002).

From a geometric-optics perspective, the incident light to the middle area 510 does not stray from orthogonal projection from the opening edge, as long as there is no element upon the optical path for diverging a light flux (e.g., a concave lens or a refracting in the direction away from optical axis). However, as described above, from a wave-optics perspective, there are cases wherein refraction occurs and the light flux stray from orthogonal projection from the opening edge, resulting in loss. Therefore, according to the present invention, the focal point of light incident in the middle area 510 is positioned in the upper region. Also, the focal point of light incident in the periphery area 520 is preferably positioned in the upper region. Note that when the light condensing member 300 has an aberration, there are cases wherein the focal point of the incident light to the periphery area 520 differs from the focal point of the light incident in the middle area 510. In such cases also, the focal point of the incident light to the periphery area 520 is preferably positioned in the upper region, and more preferably positioned in the upper middle region.

The position of the focal point 500 is determined by the physical properties of the material of each layer of the multiple layers that the optical axis 501 of the light condensing member 300 passes through (primarily the refractive index), the surface form, thickness, layering order of multiple layers, wavelength of incident light, and a combination thereof. Further, from a wave-optics perspective, the configuration of other than the light condensing member 300, e.g. the refractive index and form of the insulation layer 200 and light path member 220 also influence the position of the focal point 500.

In order to position the focal point 500 in the upper region, the configuration of the light condensing member 300 has to be determined, using an optical analysis simulator. The position of the focal point 500 is influenced by wave-optics factors, whereby for an optical analysis simulator, using a three-dimensional wave-optics analysis simulator which uses the FDTD (Finite Difference Time Domain) method is desirable. FIG. 2 described above shows the analysis results by FDTD. Note that in analyzing, there are no practical problems even if a portion (particularly the form) of the configuration of the light condensing member 300 is replaced with a similar configuration.

A specific configuration for positioning the focal point 500 in the upper region will be described below with an applicable CMOS-type or the like of a pixel amplifying photoelectric conversion element as an example, as first through eighth embodiments. Note that in the embodiments below, the refractive index of the light path member 220 is higher than the refractive index of the insulation layer 200.

Regarding various materials, typically the refractive index of silicon nitride ($Si_3N_4$) is 1.8 to 2.3, the refractive index of silicon oxynitride ($SiO_xN_y$) is 1.6 to 1.9, the refractive index of silicon oxide ($SiO_2$) is 1.4 to 1.5, and the refractive index of BPSG, PSG, and BSG is 1.4 to 2.0. To facilitate description hereinafter, we will say that refractive index of silicon oxide<refractive index of silicon oxynitride<refractive index of silicon nitride holds. Note that the refractive index of resin is generally 1.3 to 2.0, and differs by type.

The present invention is not restricted to the following embodiments, and combinations, modifications, omission of partial configurations, and changes to material of the configurations, of the first through eighth embodiments can be made without departing from the scope of the present invention. The present invention can also be applied to a rear projection type photoelectric conversion element or charge-transfer (CCD type) photoelectric conversion element.

First Embodiment

Figure 3:
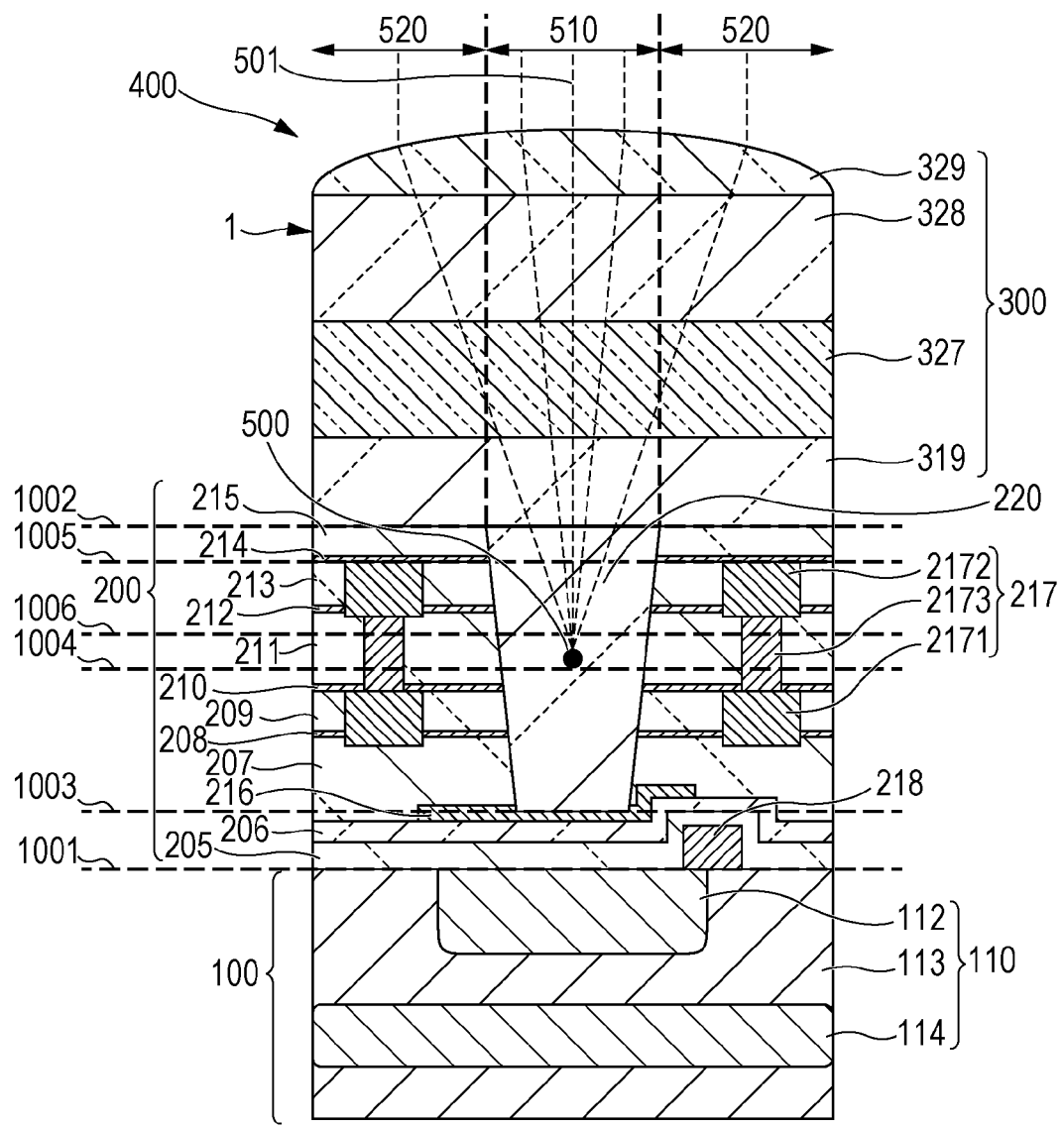
FIG. 3 is a cross-sectional schematic diagram describing a first embodiment of a photoelectric conversion element.

FIG. 3 is a cross-sectional schematic diagram to describe an example of a photoelectric conversion element 1 of the first embodiment. An $N^+$ type semiconductor region 112 is provided in a semiconductor substrate 100 made up of N-type silicon. An N-type semiconductor region 113 is provided in the periphery including the lower portion of the N+ type semiconductor region 112. A P-type semiconductor region 114 is provided in the lower portion of the N-type semiconductor region 113. The $N^+$ type semiconductor region 112 can function primarily as a charge storage region. The $N^+$ type semiconductor region 112 and N-type semiconductor region 113 and P-type semiconductor region 114 can make up a portion of the photoelectric conversion portion 110.

An insulation layer 200 is provided on the main face 101. The insulation layer 200 is a multi-layer film. The insulation layer 200 has, in order from the main face 101 side, a first insulation layer 205, second insulation layer 206, third insulation layer 207, fourth insulation layer 208, fifth insulation layer 209, sixth insulation layer 210, seventh insulation layer 211, eighth insulation layer 212, ninth insulation layer 213, tenth insulation layer 214, and eleventh insulation layer 215. Also the insulation layer 200 includes a twelfth insulation layer 216 that is positioned between a portion of the second insulation layer 206 and a portion of the third insulation layer 207.

Of these insulation layers, the second insulation layer 206, fifth insulation layer 209, ninth insulation layer 213, and eleventh insulation layer 215 are made of silicon oxide ($SiO_2$). The third insulation layer 207 is made of BPSG (borophosphosilicate glass), but instead of BPSG, PSG (phosphosilicate glass) or BSG (borosilicate glass) may be used. Of these insulation layers, the first insulation layer 205, fourth insulation layer 208, sixth insulation layer 210, eighth insulation layer 212, tenth insulation layer 214, and twelfth insulation layer 216 are made of silicon nitride ($Si_3N_4$). The thickness of the insulation layer 200 is the total of the thicknesses of the first through eleventh layers, and the distance T is substantially the same as the thickness of the insulation layer 200. Now, the eleventh insulation layer 215 forms the upper face 202 of the insulation layer 200. Also, the twelfth layer 216 forms the floor face 203 of the opening portion 201.

Wiring 217 is provided within the insulation layer 200. The wiring 217 may be a multi-layer wiring, and FIG. 3 shows an example wherein the wiring 217 is configured with a first wiring layer 2171, second wiring layer 2172, and contact layer 2173 (via). The contact layer 2173 is positioned between the first wiring layer 2171 and second wiring layer 2172, and connects the first wiring layer 2171 and second wiring layer 2172 with one another. An example of a layered wiring having two layers is shown, but further wiring layers may be provided between the first wiring layer 2171 and second wiring layer 2172 to have a three-layer or more layered wiring. Conductive materials such as copper, aluminum, tungsten, tantalum, titanium, polysilicon, and the like can be used for the wiring 217. A typical wiring 217 is opaque, and has metallic luster. A gate electrode 218 of a transfer gate having a MOS configuration is provided on the main face 101 of the semiconductor substrate 100. The gate electrode 218 is made of polysilicon, and is connected to the first wiring layer 2171 via an unshown contact layer (plug).

An example of the wiring 217 will be given. The unshown plug is made primarily of tungsten, and can be formed by single damascene method. The first wiring layer 2171 is made primarily of copper, and can be formed integrally by single damascene method. The contact layer 2173 and second wiring layer 2172 are made primarily of copper, and can be formed to be integrated by dual damascene method. In this event, the fourth insulation layer 208, sixth insulation layer 210, and eighth insulation layer 212 can be used as an etching control layer and copper dispersion preventing layer, and the tenth insulation layer 214 can be used as a copper dispersion preventing layer. Note that the first wiring layer 2171, second wiring layer 2172, contact layer 2173, and plug can have a barrier metal made primarily of tantalum or the like near the interface with the insulation layer 200.

The flat shape of the side face 204 of the opening portion 201 (the shape of the opening portion 201 in a plane that is parallel to the first plane 1001) is in a closed loop shape, and may be a circle, oval, rounded quadrangle, quadrangle, or hexagon. Here the shape is a circle. Accordingly, the floor face 203 is also circular. The width (diameter) of the opening edge of the opening portion 201 (the side face 204 in the second plane 1002) is typically 10 µm or less, and preferably 5.0 µm or less. In the case that the width of the opening edge is 2.0 µm or less, the present invention provides a particularly significant advantage. Accordingly to the present invention, the width of the opening edge is approximately 1.5 µm.

The cross-sectional shape of the opening portion 201 (shape of the opening portion 201 in a plane orthogonal to the first plane 1001) may be an inverted trapezoid, trapezoid (normal trapezoid), rectangle, square, or a step form whereby these are combined.

The floor face of the opening portion 201 is positioned in the range where the third insulation layer 207 exists. In other words, the third insulation layer 207 is positioned in the third plane. The floor face of the opening portion 201 (third plane 1003) is preferably positioned nearer the semiconductor substrate 100 than the first wiring layer 2171.

The light path member 220 is positioned on the inner side of the opening portion 201. The lower face (emitting face) of the light path member 220 is in contact with the floor face of the opening portion 201. Therefore, the lower face 203 of the opening portion 201 and the lower face of the light path member 220 substantially match, and the lower face of the light path member 220 is positioned in the third plane 1003. The light path member 220 is surrounded by the insulation film 200. Specifically, the light path member 220 is surrounded by the third insulation layer 207, fourth insulation layer 208, fifth insulation layer 209, sixth insulation layer 210, seventh insulation layer 211, eighth insulation layer 212, ninth insulation layer 213, tenth insulation layer 214, and eleventh insulation layer 215 of the insulation film 200. The shape of the light path member 220 generally matches the shape of the opening portion 201 in a substantial manner.

According to the present embodiment, the light path member 200 has a truncated cone shape, but according to the shape of the opening portion 201, the light path member 220 may be a truncated pyramid shape, a square column shape, or a cylindrical shape.

The method to form the light path member 220 and insulation layer 200 is not restricted in particular. Typically, a first forming method can be used, wherein, upon having performed etching processing on a multi-layer insulation film which has no opening portion 201 and forming the insulation layer 200 which has the opening portion 201, the material of the light path member 200 within the opening portion 201 can be accumulated to form the light path 220. Additionally, a second forming method may be used, wherein, each time an insulation layer making up the insulation film 200 is formed, a process to etch the insulation layer and provide an opening portion and a process to dispose the material of the light path member 220 in the opening portion are repeated. Also, a third forming method may be used, wherein the insulation layer of a portion of the insulation film 200 is disposed in the periphery of the light path member 220 after the light path member 220 is disposed.

The present embodiment shows an example using the first forming method. The twelfth insulation layer 216 makes up a portion of the insulation film 200, and makes up the floor face 203 of the opening portion 201. The twelfth insulation layer 216 is disposed on the upper portion of the light receiving face and the upper portion of a portion of the gate electrode 218. The area of the twelfth insulation layer 216 in the plane direction is greater than the area of the floor face 203. Also, the area of the twelfth insulation layer 216 in the plane direction is greater than the area of the first insulation layer 205 and second insulation layer 206.

The twelfth insulation layer 216 can function as an etching stopper in the event of forming an opening portion 201 on the insulation layer 200. If a layer having a refractive index between the refractive index of the light path member 220 and the refractive index of the photoelectric conversion portion 110 (here, the second insulation layer 206 made up of silicon oxide) is provided between the light path member 220 and photoelectric conversion portion 110, transmittance from the light path member 220 to the photoelectric conversion portion 110 improves.

Here, the floor face of the opening portion 201 is positioned in a range wherein the third insulation layer 207 exists. In other words, the third insulation layer 207 is positioned in the third plane 1003. The floor face (third plane 1003) of the opening portion 201 is preferably positioned nearer the semiconductor substrate 100 than the first wiring layer 2171.

Note that in the case that the insulation layer 200 is a multi-layer film, the refractive index of part of the layers of the multi-layer film may be equal to or greater than the refractive index of the light path member 220. Such layers are called high refractive index insulation layers. On the other hand, the remaining layers of the multi-layer film, having a refractive index lower than the refractive index of the light path member 220 are called low refractive index insulation layers.

In the case of the present embodiment, the light path member 220 is silicon oxynitride, whereby of the insulation film 200, the fourth insulation layer 208, sixth insulation layer 210, eighth insulation layer 212, and tenth insulation layer 214 are made of silicon nitride and form the side face 204 of the opening portion 201, and so are high refractive index insulation layers. For example, in the case that the refractive index of the light path member 220 is approximately 1.9, when the fourth insulation layer 208, sixth insulation layer 210, eighth insulation layer 212, and tenth insulation layer 214 have refractive indexes of approximately 2.0, these insulation layers are high refractive index layers. Note that the first insulation layer 205 is also a high refractive index layer, but does not form the side face 204 of the opening portion 201.

However, undesirable for such layers having a refractive index equal to or greater than that of the light path member 220 (high refractive index insulation layers) to form a majority of the side face 204 of the opening portion 201. This is because the light incident in the light path member 220 is transported within the high refractive index layers, and has the potential of leaking from the opening portion 201. Therefore, the side face 204 of the opening portion 201 that is formed by the high refractive index layer is preferably less than half of the entire area of the side face 204 of the opening portion 201, and more preferably less than one-fourth. In other words, of the multi-layer film, layers with a refractive index lower than that of the light path member 220 (low refractive index insulation layers) preferably form half or more of the entire area of the side face 204 of the opening portion 201 is favorable, and more preferably form three-fourths or more. The area of the side face 204 formed by the various layers can be adjusted by appropriately setting the thickness of the various layers and angle of the side face 204. The thickness of one low refractive index insulation layer is typically 0.10 μm or greater and 0.60 μm or less. The thickness of one high refractive index insulation layer is preferably $\lambda/2N_{OH}$ or less, and more preferably $\lambda/4N_{OH}$ or less, where the wavelength of the light incident in the light path member 220 is $\lambda$ and the refractive index of the high refractive index insulation layer is $N_{OH}$. The thickness of the high refractive index insulation layer is typically 0.010 μm or greater and 0.10 μm or less.

The configuration of the light condensing member 300 will be described. The light condensing member 300 is made by layering, in order, an intermediate layer 319, color filter layer 327, lens base layer 328, and lens body layer 329 from the second plane 1002. At least the lens body layer 329 constitutes a lens layer, and the lens base layer 328 also can constitute the lens layer together with the lens body layer 329.

The incident side surface (upper face in FIG. 3) of the lens base layer 328 forms an ideal spherical surface, approximate spherical surface, or non-spherical surface that is convex toward the incident side (hereafter, these will be all called curved faces), i.e. has a convex lens shape. Thus, the light incident in the lens body layer 329 is condensed as the light approaches the optical axis 501. The lens base layer 328 and lens body layer 329 are made of the same organic material (resin), and the lens base layer 328 and lens body layer 329 are in contact with each other. That is to say, the lens base layer 328 and lens body layer 329 are provided so as to be substantially integrated. Observing the boundary of the lens base layer 328 and lens body layer 329 is often difficult. In such cases, a plane linking the edges of the curved face region of the lens body layer 329 can be situated on an imaginary boundary. Note that the lens base layer 328 may be omitted, and have a configuration wherein the lens body layer 329 and color filter layer 327 are in contact.

The shape (particularly the curvature, height, and width) of a curved face, and the physical properties (particularly the refractive index) of the material of the lens body layer 329 greatly influence the position of the focal point 500. To summarize, the greater the curvature is, the farther the position of the focal point 500 is from the first plane 1001. The physical properties (particularly the refractive index) and thickness of the material of lens base layer 328 is influenced by the distance at which the condensed light nears the optical axis 501 in the lens base layer 328, whereby this is one element for determining the focal point 500. A typical lens body layer 329 refractive index is 1.6 to 2.0.

The color filter layer 327 is made up an organic material (resin) that includes color material. A dye can be used for the color material, or a pigment may be used. The physical properties (particularly the refractive index) and thickness of the material of the color filter layer 327 is influenced by the distance at which the light refracted at the boundary of the lens base layer 328 and color filter layer 327 near the optical axis 501 in the color filter layer 327, and therefore becomes one element for determining the focal point 500. The thickness of a typical color filter layer 327 is 0.1 to 1.0 µm, and the refractive index is 1.4 to 1.6.

The intermediate layer 319 is made up of silicon oxynitride, as with the light path member 220, and the intermediate layer 319 is in contact with the light path member 220. Therefore, the intermediate layer 319 and light path member 220 are provided so as to be substantially integrated. The intermediate layer 319 is equivalent to the innermost layer 302 described with reference to FIG. 1. The intermediate layer 319 has a function to adjust the distance between the lens body layer 329 and light path member 220, and by appropriately setting the thickness of the intermediate layer 319, the position of the focal point 500 can be controlled. The thickness of a typical intermediate layer 319 is 0.080 µm or greater. On the other hand, when the intermediate layer 319 is significantly thick, the incident light amount to the light path member 220 decreases. The thickness of the intermediate layer 319 is preferably the depth D of the opening portion 201 or less, and more preferably half or less of the depth D of the opening portion 201. Also, the thickness of the intermediate layer 319 is preferably $\lambda/4N_{319}$ or greater and $2\lambda/N_{319}$ or less, where preferably the wavelength of the incident light is $\lambda$ and the refractive index of the intermediate layer 319 is $N_{319}$. The thickness of a typical intermediate layer 319 is 0.20 µm or less.

Second Embodiment

Figure 4:
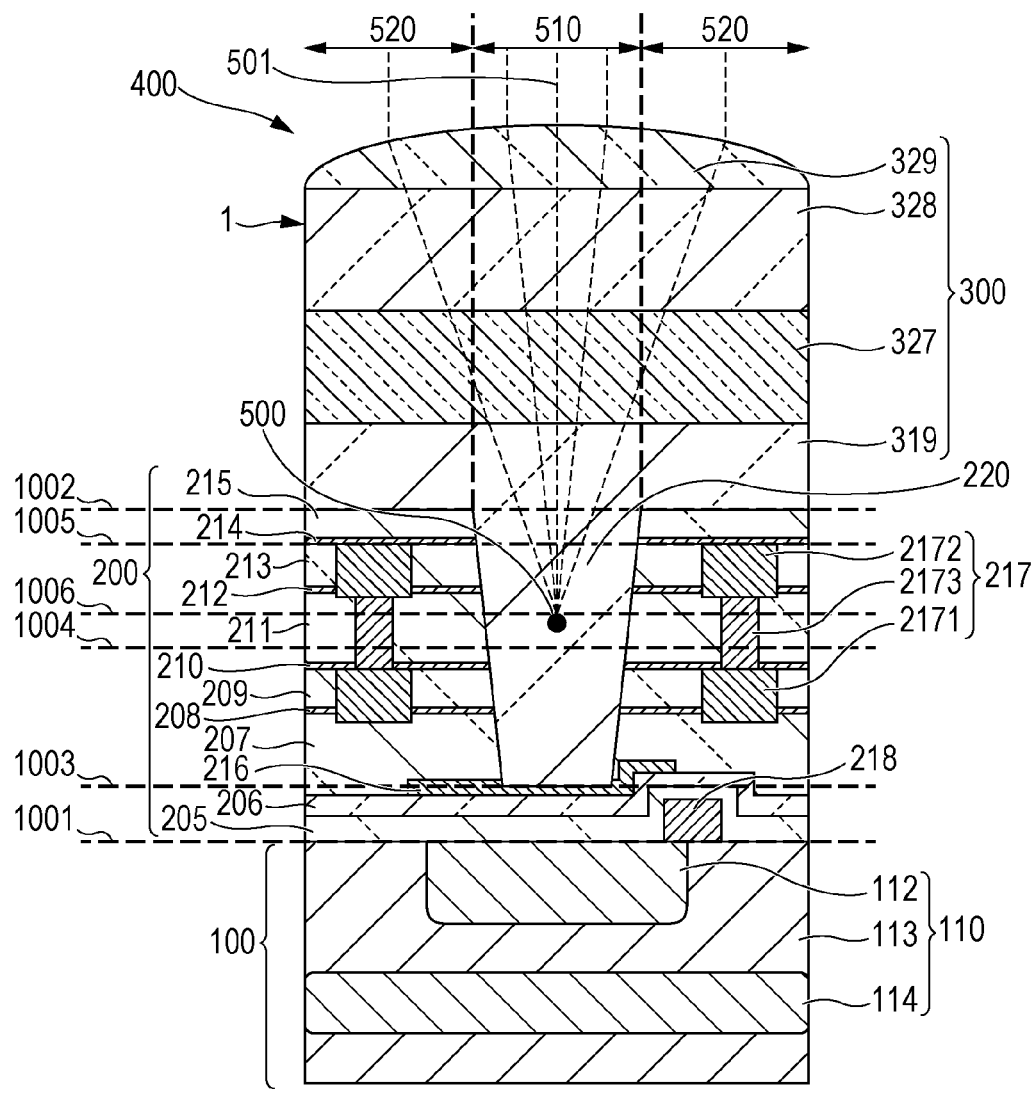
FIG. 4 is a cross-sectional schematic diagram describing a second embodiment of the photoelectric conversion element.

A second embodiment will be described with reference to FIG. 4. According to the present embodiment, the refractive index of the intermediate layer 319 which is the innermost layer of the light condensing member 300 is higher than the refractive index of the light path member 220. Here, the light path member 220 is made of silicon oxynitride, and the intermediate layer 319 is made of silicon nitride. Other than this point, the second embodiment is the same as with the first embodiment, so description will be omitted here.

According to the present embodiment, the refractive index of the intermediate layer 319 is higher than the refractive index of the light path member 220. Therefore, of the light incident in the light path member 220 from the intermediate layer 319, the light incident diagonally in the interface between the intermediate layer 319 and light path member 220 follows Snell's Law, and refracts in the direction nearing the optical axis 501. Accordingly, the position of the focal point 500 can be nearer the upper middle region as compared to the first embodiment.

Note that as compared to the first embodiment, the difference in reflexive indices between the intermediate layer 319 and color filter layer 327 is increased, whereby in the intermediate layer 319, refraction in the direction away from the optical axis 501 readily occurs. Accordingly, the thickness of the intermediate layer 319 is preferably thinner as compared to the first embodiment.

Third Embodiment

Figure 5:
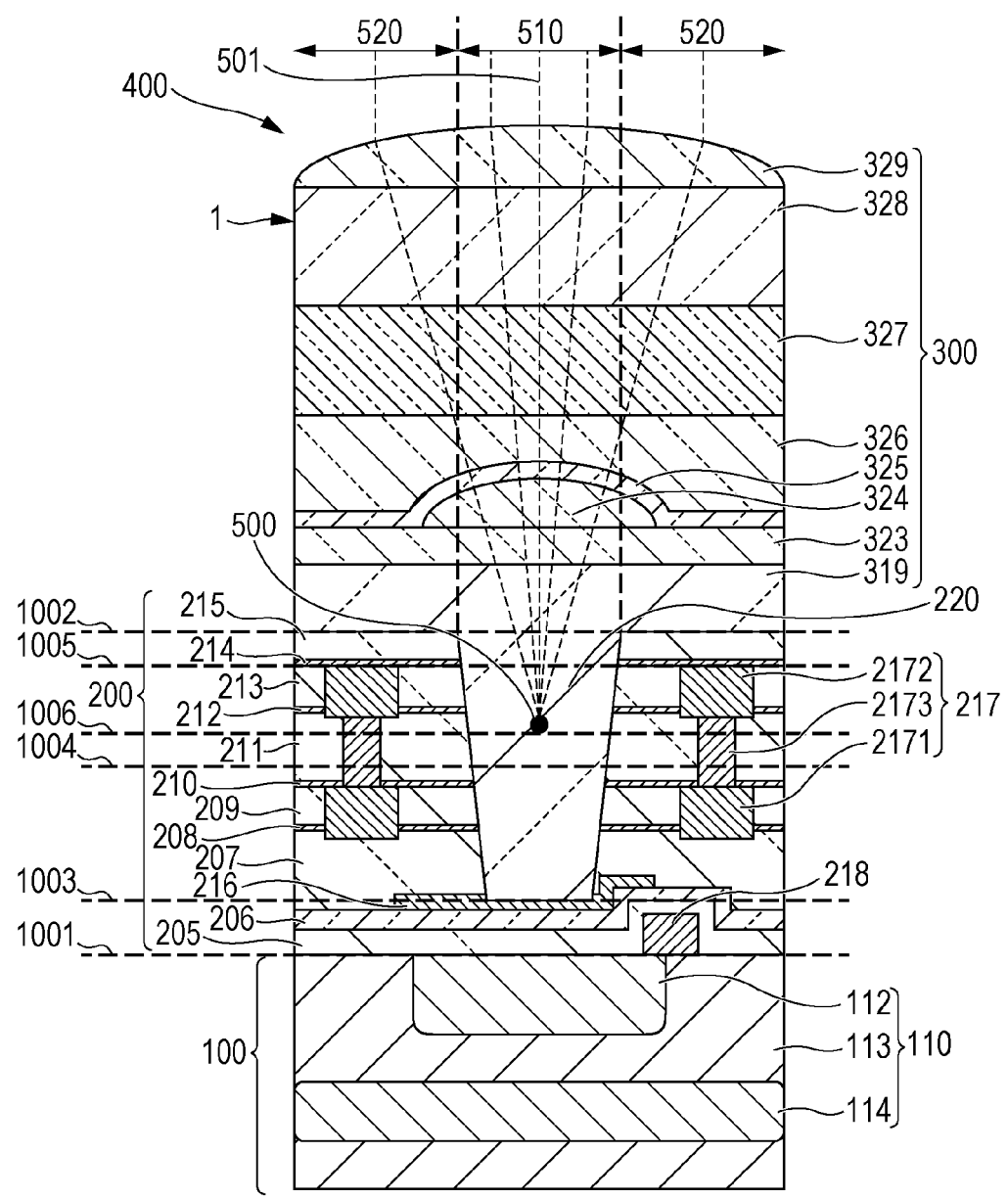
FIG. 5 is a cross-sectional schematic diagram describing a third embodiment of the photoelectric conversion element.

A third embodiment will be described with reference to FIG. 5. According to the present embodiment, the light condensing member 300 has two lens body layers of a first lens body layer 329 and a second lens body layer 324. At least the first lens body layer 329 constitutes a first lens layer, and at least the second lens body layer 324 constitutes a second lens layer. Specifically, between the second plane 1002 and color filter layer 327 in the second embodiment, in order from the second plane 1002 side, a first intermediate layer 319, second lens base layer 323, second lens body layer 324, second lens coating layer 325, and second intermediate layer 326 are provided. The second lens base layer 323 also can constitute the second lens layer together with the second lens body layer 324. The first lens base layer 328 and first lens body layer 329 may be the same as the lens base layer 328 and lens body layer 329 of the first and second embodiments. The lens base layer 328 also can constitute the first lens layer together with first lens body layer 329. The first intermediate layer 319 may be the same as the intermediate layer 319 of the second embodiment, and is made of silicon nitride. Also, the light path member 220 and intermediate layer 319 are made of silicon nitride. Other than these points, the third embodiment is the same as with the second embodiment, so description will be omitted.

The second intermediate layer 326 is made of an organic material (resin), and has a function to adjust the distance between the first lens body layer 329 and second lens body layer 324. Also, the second intermediate layer 326 is smoothed as to the curved shape of the second lens body layer 324, and also has a function to control the incline of the light path in the color filter layer 327, first lens base layer 328, and first lens body layer 329. The thickness at the thinnest portion of the second intermediate layer 326 is typically 0.1 to 0.5 µm. The refractive index of the second intermediate layer 326 is 1.4 to 1.5.

The second lens substrate 323 and second lens body layer 324 are made of an organic material (resin), and the second lens body layer 324 has a convex lens shape (flat convex lens shape). Note that the refractive index of the second lens body layer 324 is higher than the refractive index of the second intermediate layer 326. Therefore, the light condensed with the first lens body layer 329 can be further condensed, and the position of the focal point can be placed nearer to the upper middle region.

Also, according to the present embodiment, silicon nitride is used for the light path member 220. Accordingly, as compared to the first and second embodiments, the refractive index differences between the low refractive index insulation layers (third insulation layer 207, fifth insulation layer 209, ninth insulation layer 213, and eleventh insulation layer 215) of the light path member 220 and insulation film 200 are increased. Therefore, the amount of light that leaks from the light path member 220 toward the low refractive index insulation layer of the insulation film 200 can be decreased. Also, as compared to the first and second embodiments, the refractive index differences between the high refractive index insulation layers (fourth insulation layer 208, sixth insulation layer 210, eighth insulation layer 212, and tenth insulation layer 214) of the light path member 220 and insulation film 200 are decreased (are approximately the same). Therefore, the amount of light that leaks from the light path member 220 toward the high refractive index insulation layer of the insulation film 200 can be decreased.

The second lens coating layer 325 is made of silicon oxide, and has a refractive index that is between the refractive index of the second lens body layer 324 and the refractive index of the second intermediate layer 326. Thus, if the second lens coating layer 325 has a refractive index that is between the refractive index of the second lens body layer 324 and the refractive index of the second intermediate layer 326, incident light from the second intermediate layer 326 to the second lens body layer 324 increases. This is so that the reflection is suppressed at the boundary between the second intermediate layer 326 and second lens body layer 324 which can occur in the case of not providing a second lens coating layer 325, and so as to increase transmittance.

The thickness of the second lens coating layer 325 is preferably smaller than the thickness of the second lens body layer 324, and more preferably half or less of the thickness of the second lens body layer 324. The thickness of the second lens coating layer 325 is preferably $(M-0.5)/4N_{325}$ times to $(M+0.5)/4N_{325}$ times the wavelength of the incident light, and more preferably $M/4N_{325}$ times the wavelength of the incident light. Now, M is an odd number, and $N_{325}$ is the refractive index of the second lens coating layer 325. M is preferably 1 or 3, and more preferably 1. When the thickness of the second lens coating layer 325 is thus set, interference between the reflected light off the surface of the second lens body layer 325 and the reflected light off the surface of the second lens coating layer 325 can be weakened, and a reflection suppression function can be provided from a wave-optics perspective.

Fourth Embodiment

Figure 6:
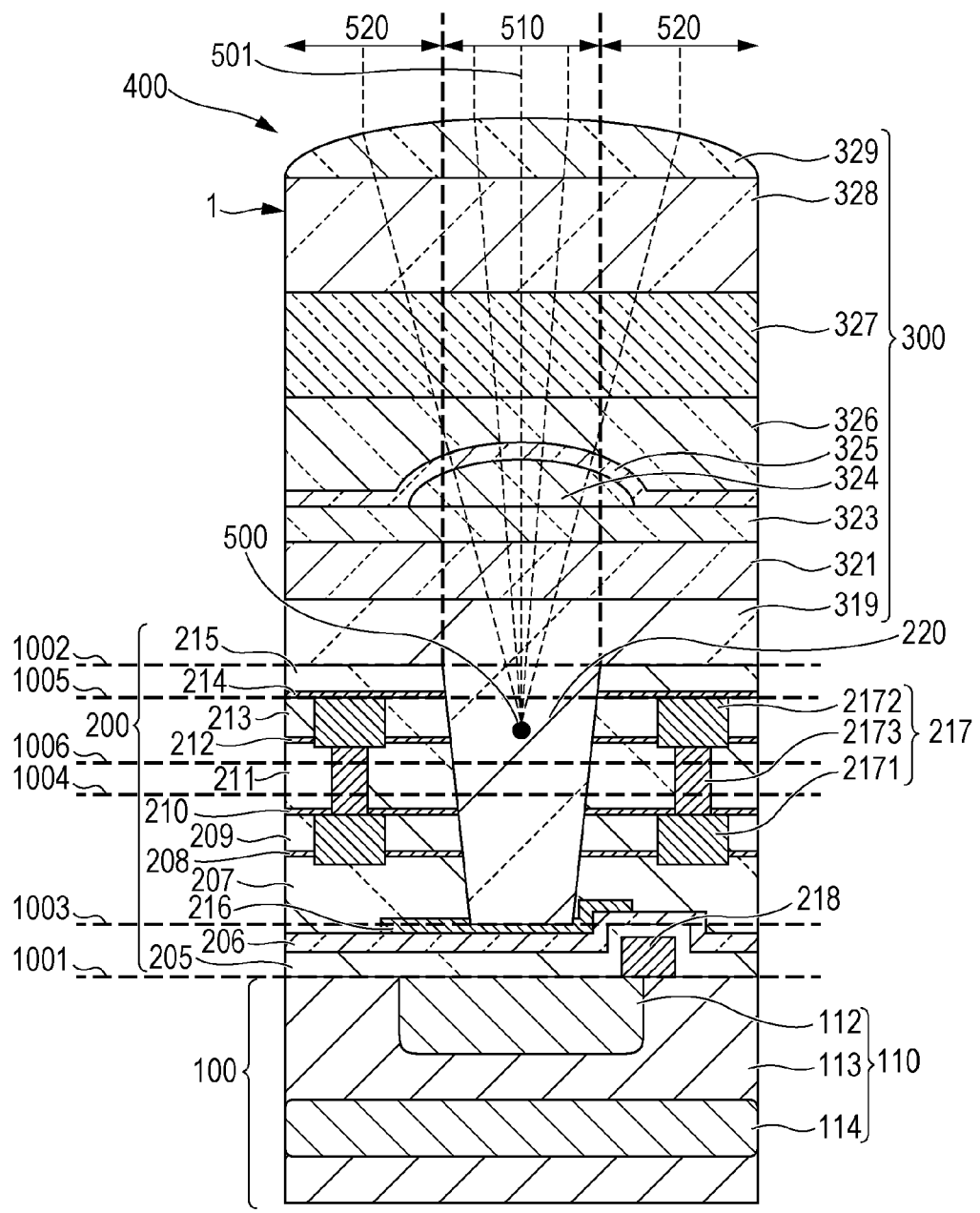
FIG. 6 is a cross-sectional schematic diagram describing a fourth embodiment of the photoelectric conversion element.

A fourth embodiment will be described with reference to FIG. 6. According to the present embodiment, the light condensing member 300 has a low refractive index layer 321. Specifically, the low refractive index layer 321 is provided between the first intermediate layer 319 and second lens base layer 323 of the third embodiment. The low refractive index layer 321 is made of silicon nitride. Also, the second lens base layer 323 and second lens body layer 324 are made of silicon nitride. Other than these points, the fourth embodiment is the same as with the third embodiment, so description will be omitted.

When the second lens body layer 324 is made of silicon nitride, the refractive index of the second lens body layer 324 can be increased as compared to the case of being made of resin. Therefore, the refractive index difference between the second intermediate layer 326 and second lens body layer 324 is increased as compared to the third embodiment, and light condensing function (power) can be increased. Therefore, the focal point 500 can be set to a more favorable position.

According to the third embodiment, the refractive index of the first intermediate layer 319 is higher than the refractive index of the second lens base layer 323, whereby at the interface of the first intermediate layer 319 and the second lens base layer 323, refraction in the direction away from the optical axis 501 occurs, following Snell's Law. According to the fourth embodiment, even if hypothetically the first intermediate layer 319 and the second lens base layer 323 are in contact with without a low refractive index layer 321 being provided, the refractive index difference of the two is small (or non-existent), as both are made of silicon nitride, whereby refraction in the direction away from the optical axis can be reduced. Further, according to the fourth embodiment, a low refractive index layer 321 that forms a boundary with the second lens base layer 323 is provided between the second lens base layer 323 and first intermediate layer 319. Therefore, at the boundary between the second lens base layer 323 and low refractive index layer 321, refraction occurs in the direction nearing the optical axis 501, following Snell's Law. Therefore, the focal point 500 can be set at a more favorable position so as to supplement the second lens body layer 324 which is limited regarding improvement in light condensing capabilities due to manufacturing restrictions. Note that similar advantages can be obtained even with a configuration wherein the second lens base layer 323 is omitted and the second lens body layer 324 and low refractive index layer 321 are in contact. Also, even if a high refractive index layer having a refractive index that is higher than the refractive index of the low refractive index 321 is provided between the second lens base layer 323 and low refractive index layer 321, refraction in the direction nearing the optical axis 501 can be similarly restricted from occurring at the interface between the high refractive index layer and low refractive index layer 321.

On the other hand, the refractive index of the low refractive index layer 321 is lower than the refractive index of the first intermediate layer 319, whereby at the interface between the low refractive index layer 321 and first intermediate layer 319, refraction occurs in the direction away from the optical axis 501 following Snell's Law. However, the interface between the low refractive index layer 321 and first intermediate layer 319 is closer to the light path member 220 than the interface between the second lens base layer 323 and low refractive index layer 321. Therefore, influence of refraction on the position of the focal point 500 at the interface between the low refractive index layer 321 and first intermediate layer 319 is small as compared to refraction at the interface between the second lens base layer 323 and low refractive index layer 321.

In practice, the refractive index of the low refractive index layer 321 is preferably 0.95 times or less the refractive index of the second lens base layer 323 (or the second lens body layer 324), and more preferably 0.85 times or less. As in the third embodiment, even in the case of using resin for the material of the second lens base layer 323, the low refractive index layer 321 can be provided as in the present embodiment. In the case that the second lens base layer 323 (or second lens body layer 324) is made of silicon nitride, in practice, a refractive index of 1.40 or greater and 1.60 or less is preferable for the low refractive index layer 321.

Fifth Embodiment

A fifth embodiment will be described with reference to FIG. 7. According to the present embodiment, the light condensing member 300 has a first intermediate refractive index layer 322 and a second intermediate refractive index layer 320. Specifically, the first intermediate refractive index layer 322 is provided between the second lens base layer 323 and low refractive index layer 321 of the fourth embodiment, and the second intermediate refractive index layer 320 is provided between the low refractive index layer 321 and intermediate layer 319. The material of the first intermediate refractive index layer 322 and second intermediate refractive index layer 320 is silicon oxynitride, and the material of the low refractive index layer 321 is silicon oxide. Other than these points, the fifth embodiment is the same as with the fourth embodiment, so description will be omitted.

The upper face of the first intermediate refractive index layer 322 forms an interface with the lower face of the second lens base layer 323, and the refractive index of the first intermediate refractive index layer 322 is lower than the refractive index of the second lens base layer 323. The upper face of the low refractive index layer 321 forms an interface with the lower face of the first intermediate refractive index layer 322, and the refractive index of the low refractive index layer 321 is lower than the refractive index of the first intermediate refractive index layer 322. Therefore, the first intermediate refractive index layer 320 has a refractive index between the refractive index of the second lens base layer 323 and the refractive index of the low refractive index layer 321. The upper face of the second intermediate refractive index layer 320 forms an interface with the lower face of the low refractive index layer 321, and the refractive index of the second refractive index layer 320 is higher than the refractive index of the low refractive index layer 321. The lower face of the second intermediate refractive index layer 320 forms an interface with the upper face of the first intermediate layer 319, and the refractive index of the second intermediate refractive index layer 320 is lower than the refractive index of the first intermediate layer 319. Therefore, the second intermediate refractive index layer 320 has a refractive index that is between the refractive index of the low refractive index layer 321 and the refractive index of the first intermediate layer 319.

In the case of the fourth embodiment, there are cases wherein reflection of the incident light occurs at the interface between the second lens base layer 323 and the low refractive index layer 321, from the refractive index difference between the second lens base layer 323 and the low refractive index layer 321. Also, there are cases wherein reflection of incident light occurs at the interface between the low refractive index layer 321 and the first intermediate layer 319, from the refractive index difference between the low refractive index layer 321 and the first intermediate layer 319. The reflective rate R at this time can be expressed as $R=(N_{321}-N_{319})^2/(N_{321}+N_{319})^2$. Now, $N_{321}$ is the refractive index of the low refractive index layer 321, and $N_{319}$ is the refractive index of the first intermediate layer 319.

According to the fifth embodiment, the refractive index difference between the second lens base layer 323 and the first intermediate refractive index layer 322 and the refractive index difference between the intermediate refractive index layer 322 and the low refractive index layer 321 are both smaller than the refractive index difference between the second lens base layer 323 and the low refractive index layer 321. Accordingly, transmittance from the second lens base layer 323 to the low refractive index 321 can be improved, and the light amount incident in the low refractive index layer 321 can be increased.

Also, the refractive index difference between the low refractive index layer 321 and second intermediate refractive index layer 320 and the refractive index difference between the second intermediate refractive index layer 320 and first intermediate layer 319 are both smaller than the refractive index difference between the low refractive index layer 321 and first intermediate layer 319. Accordingly, transmittance from the low refractive index layer 321 to the first intermediate layer 319 can be improved, and the light amount incident in the first intermediate layer 319 can be increased.

Also according to the present embodiment, in practical use, the refractive index of the low refractive index layer 321 is preferably 0.95 times or less of the refractive index of the second lens base layer 323 (or second lens body layer 324), and more preferably 0.85 times or less. The refractive index of the low refractive index layer 321 is preferably 1.40 or greater and 1.60 or less.

The thickness of the low refractive index layer 321 is preferably 60 nm or greater and 500 nm or less, and more preferably 80 nm or greater and 200 nm or less. Also, the thickness of the first intermediate refractive index layer 322 is preferably 20 nm or greater and 300 nm or less, and more preferably 40 nm or greater and 150 nm or less. As with the first intermediate refractive index layer 322, the thickness of the second intermediate refractive index layer 320 is preferably 20 nm or greater and 300 nm or less, and more preferably 40 nm or greater and 150 nm or less.

The refractive index $N_{322}$ of the first intermediate refractive index layer 322 is preferably $(N_{323}+N_{322})/4$ or greater, and also preferably $3\times(N_{323}+N_{322})/4$ or less. Now, $N_{323}$ is the refractive index of the first second lens base layer 323. The refractive index $N_{320}$ of the second intermediate refractive index layer 320 is preferably $(N_{329}+N_{320})/4$ or greater, and also preferably $3\times(N_{319}+N_{320})/4$ or less.

In the case that the refractive index of the second lens base layer 323 is higher than the refractive index of the first intermediate layer 319, the refractive index of the first intermediate refractive index layer 322 is preferably higher than the refractive index of the second intermediate refractive index layer 320. That is to say, $N_{321}<N_{320}<N_{322}<N_{319}<N_{323}$ is preferable. Conversely, in the case that the refractive index of the second lens base layer 323 is lower than the refractive index of the first intermediate layer 319, the refractive index of the first intermediate refractive index layer 322 is preferably lower than the refractive index of the second intermediate refractive index layer 320. That is to say, $N_{321}<N_{322}<N_{320}<N_{323}<N_{319}$ is preferable. Thus, by causing the refractive index of the first intermediate refractive index layer 322 and second intermediate refractive index layer 320 to differ depending on the refractive index of the members above and below thereof, transmittance of light from the second lens base layer 323 to the first intermediate layer 319 can be improved, and sensitivity of the photoelectric conversion element 1 can be improved.

The thickness of the first intermediate refractive index layer 322 is preferably $(M-0.5)\lambda/4N_{322}$ to $(M+0.5)\lambda/4N_{322}$ times is favorable, where the wavelength of the incident light is $\lambda$, and more preferably $M/4N_{322}$ times the wavelength of the incident light. Here, M is an odd number, and $N_{322}$ is the refractive index of the first intermediate refractive index layer 322. M is preferably 1 or 3, and more preferably 1. When the thickness of the first intermediate refractive index layer 322 is thus set, interference between the reflected light off the interface between the first intermediate refractive index layer 322 and second lens base layer 323 and the reflected light off the interface between the first intermediate refractive index layer 322 and low refractive index layer 321 can be weakened, and a reflection suppression function can be provided from a wave-optics perspective.

Similarly, the thickness of the second intermediate refractive index layer 320 is preferably $(M-0.5)/4N_{320}$ to $(M+0.5)/4N_{320}$ times the wavelength of the incident light, and more preferably $M/4N_{320}$ times the wavelength of the incident light. Now, M is an odd number, and $N_{320}$ is the refractive index of the second intermediate refractive index layer 320.

As described with the fourth embodiment, in increasing the refraction that nears the optical axis 501 in a range having limited thickness of the various layers, the thickness of the first intermediate refractive index layer 322 and the thickness of the low refractive index layer 321 should be set as follows. First, the relative refractive index of the second lens base layer 323 and first intermediate refractive index layer 322 and the relative refractive index of the first intermediate refractive index layer 322 and low refractive index layer 321 are compared. The thickness of the medium on the emitting side of whichever the relative refractive index is greater (one of the first intermediate refractive index 322 and low refractive index layer 321) is set to be greater than the thickness of the medium of the emitting side of whichever is smaller (the other of the first intermediate refractive index 322 and low refractive index layer 321). Note that the relative refractive index here is (refractive index of incident side medium)/(refractive index of emitting side medium), and is a value greater than 1, according to the present embodiment. Note that in the description to this point, in the case that simply "refractive index" is written, this means an absolute refractive index. According to Snell's Law, the greater the relative refractive index is, the greater the emitting angle will be, so by increasing the thickness of the emitting side medium where the relative refractive index is greater, the emitted light can be brought markedly closer to the optical axis 501. For example, in the case that the refractive index of the second lens base layer 323 is 2.00, the refractive index of the first intermediate refractive index layer 322 is 1.72, and the refractive index of the low refractive index layer 321 is 1.46, then 2.00/1.72<1.72/1.46 holds. Accordingly, the thickness of the low refractive index layer 321 should be greater than the thickness of the first intermediate refractive index layer 322.

For example, the second lens base layer 323 can be a silicon nitride having a refractive index of 2.00, and the first intermediate layer 319 can be a silicon nitride having a refractive index of 1.84. Accordingly, the refractive index of the first intermediate refractive index layer 322 can be increased more than the refractive index of the second intermediate refractive index layer 320, whereby the reflected light off the lower face of the second lens base layer 323 and off the upper face of the first intermediate layer 319 can be reduced. For example, the first intermediate refractive index layer 322 can be a silicon oxynitride having a refractive index of 1.73, the low refractive index layer 321 can be a silicon oxide having a refractive index of 1.46, and the second intermediate refractive index layer 320 can be 1.65.

The relation of the first intermediate refractive index layer 322 and low refractive index layer 321 described above has been described for a case wherein the first intermediate refractive index layer 322 forms a interface with the second lens base layer 323, but the same can be said for a case wherein the second lens base layer 323 is not provided and the first intermediate refractive index layer 322 forms a interface with the second lens body layer 324. Also, the relation between the second intermediate refractive index layer 320 and low refractive index layer 321 has been described for a case wherein the second intermediate refractive index layer 320 forms a interface with the first intermediate layer 319, but the same can be said for a case wherein the first intermediate layer 319 is not provided, and the first intermediate refractive index layer 322 forms a interface with the light path member 220.

Sixth Embodiment

Figure 8:
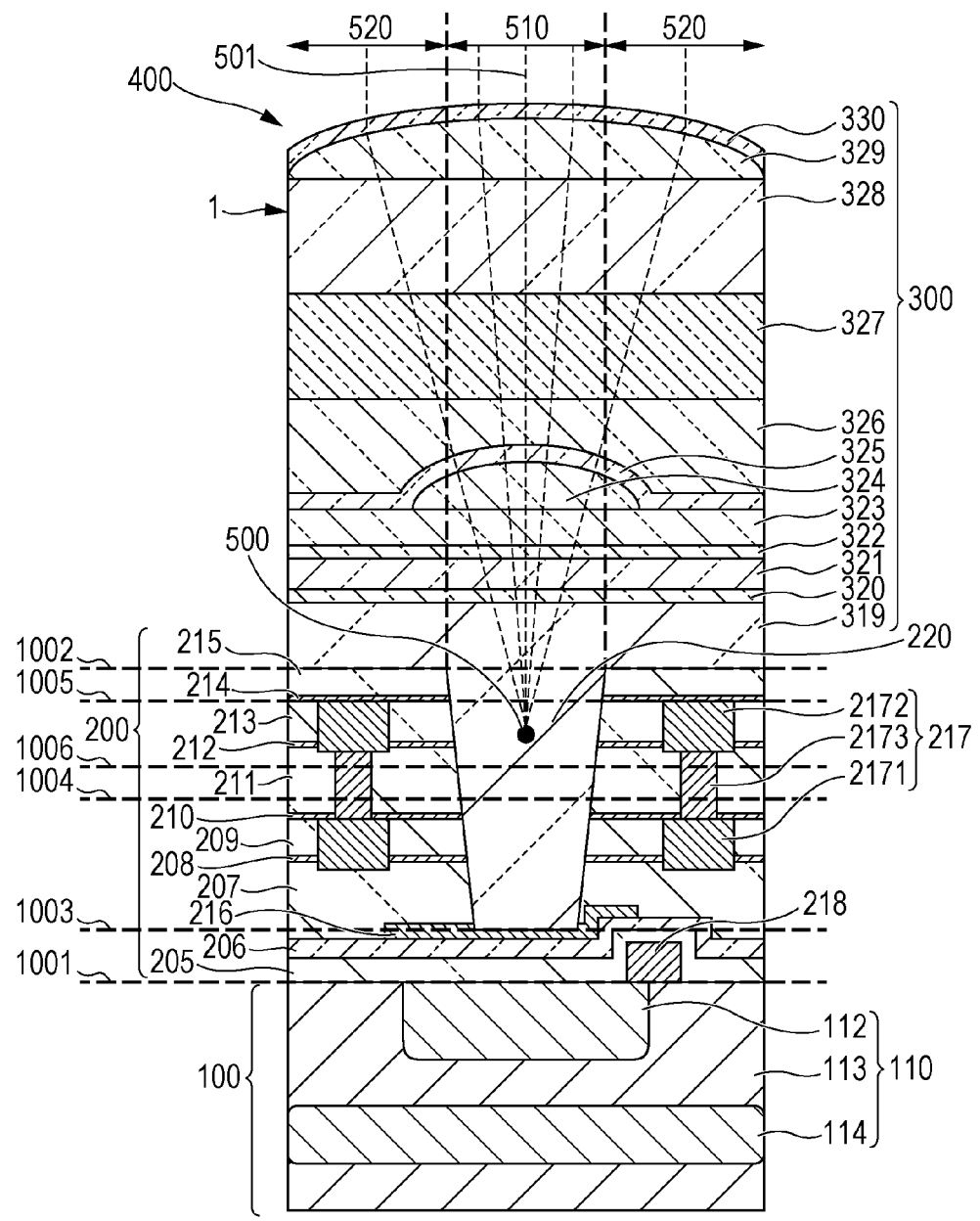
FIG. 8 is a cross-sectional schematic diagram describing a sixth embodiment of the photoelectric conversion element.

A sixth embodiment will be described with reference to FIG. 8. According to the present embodiment, the light condensing member 300 has a first lens coating layer 330 on the first lens body layer 329 of the fifth embodiment. Therefore, the first lens coating layer 330 is equivalent to the outermost layer 301 described with reference to FIG. 1. Other than these points, the sixth embodiment is the same as with the fifth embodiment, so description will be omitted.

The first lens coating layer 330 is made of a fluorine resin, and can suppress adherence by foreign matter and the like. The first lens coating layer 330 has a refractive index that is between the refractive index of the first lens body layer 329 and the refractive index of the medium 400. The refractive index of the medium 400 is 1.001 or less, and the refractive index of the first lens coating layer 330 is higher than 1.001, and is lower than the refractive index of the first lens body layer 329. The thickness of the first lens coating layer 330 can be set to be the same as with the second lens coating layer 325.

Photoelectric Conversion Apparatus

Figure 9:
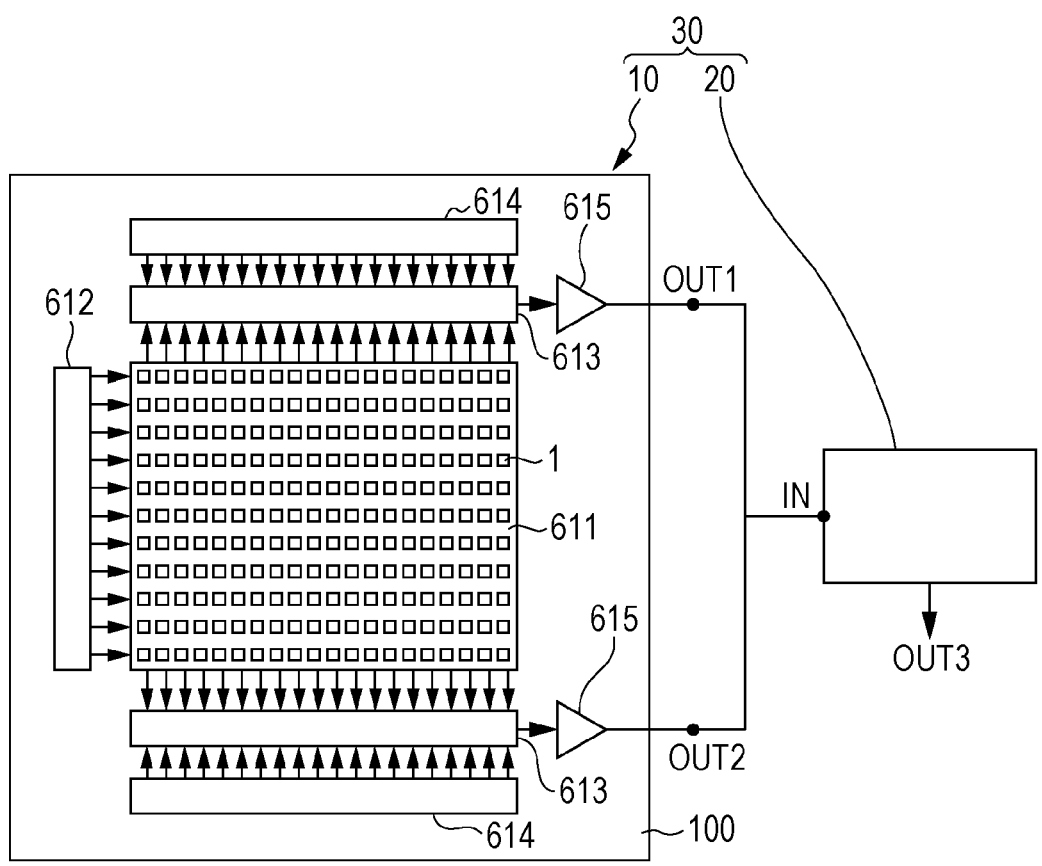
FIG. 9 is a schematic diagram describing a photoelectric conversion apparatus and imaging system.

An example of a photoelectric conversion apparatus 10 and an imaging system 30 using the same will be described with reference to FIG. 9. The photoelectric conversion apparatus 10 can be used as an imaging sensor, distance measurement sensor, or light measurement sensor, for example. The photoelectric conversion apparatus 10 may also have multiple functions of the functions serving as imaging sensor, distance measurement sensor, or light measurement sensor.

An imaging system 30 can also be constructed which has the photoelectric conversion apparatus 10 and a signal processing apparatus 20 into which electrical signals output from the photoelectric conversion apparatus 10 is input and which processes the electrical signals. FIG. 9 is a diagram showing an example of the imaging system 30. The electrical signals are output from the OUT1 and OUT2 of the photoelectric conversion apparatus 10. Now, an example providing the two output paths of OUT1 and OUT2 is shown, but there may be one output path or there may be three or more output paths. The electrical signals are input into the IN of the signal processing apparatus 20. The electrical signals may be current signals or may be voltage signals, and also may be analog signals or may be digital signals.

In the case of using the photoelectric conversion apparatus 10 as an image sensor, the signal processing apparatus 20 is configured so that, by the electrical signals being input into IN, the image signal is output from OUT3. In the case of using the photoelectric conversion apparatus 10 as a distance measurement sensor for focal point detection, the signal processing apparatus 20 is configured so that, by the electrical signals being input into IN, a driving signal for driving the lens provided on the front of the photoelectric conversion apparatus 10 is output from OUT3. In the case of using the photoelectric conversion apparatus 10 as a light measurement apparatus, the signal processing apparatus 20 is configured so that, by the electrical signals being input into IN, a control signal that controls the shutter and adjusts exposure time is output from OUT3. Note that the shutter may be a mechanical shutter or an electronic shutter, but in the case of an electronic shutter, in reality the photoelectric conversion apparatus 10 is controlled to this end. Using the photoelectric conversion apparatus 10 of the present invention as an image sensor is particularly suitable, and excellent images can be obtained.

An example of the photoelectric conversion apparatus 10 according to the imaging system 30 shown in FIG. 9 will be described. According to the present example, a pixel amplifying photoelectric conversion apparatus serving as an image sensor is used for the photoelectric conversion apparatus 10. In FIG. 9, the photoelectric conversion apparatus 10 has a pixel region 611, vertical scanning circuit 612, two readout circuits 613, two horizontal scanning circuits 614, and two output amplifiers 615. The region other than the pixel region 611 is also called a peripheral circuit region.

Multiple (many) photoelectric conversion elements 1 are arrayed in a two-dimensional form in the pixel region 611. Each photoelectric conversion element 1 is equivalent to one pixel. The spacing between each adjacent photoelectric conversion element 1 (pixel pitch) is typically 10 μm or less, and preferably 5.0 μm or less, and if 2.0 μm or less, the present invention yields particularly significant advantages. A readout circuit 613, e.g. a row amplifier, CDS circuit, adding circuit, or the like are provided in the peripheral circuit region, and perform amplification, addition, and so forth as to the signals read out via the vertical signal line from pixels in the row selected by the vertical scanning circuit 612. The row amplifier, CDS circuit, adding circuit, or the like are disposed in each pixel row or in every multiple pixel rows, for example. The horizontal scanning circuit 614 generates a signal for reading out the signals from the readout circuit 613 in order. The output amplifier 615 amplifies and outputs signals from the row selected by the horizontal scanning circuit 614.

The above-described configuration is only one configuration example of the photoelectric conversion apparatus 10, and should not be restricted to this example. The readout circuits 613 and horizontal scanning circuits 614 and output amplifiers 615 configure output paths (OUT1, OUT2) for two systems, and so are disposed so as to sandwich the pixel region 611, one on the top and one on the bottom thereof.

A representative example of the imaging system 30 is a camera such as a still camera or video camera or the like. The imaging system 30 can also have a transportation configuration (unshown) that can transport the photoelectric conversion apparatus 10. An example of a transportation configuration is wheels whereby an electric motor, reciprocating engine, rotary engine, or the like serves as a motion source. Also, an example of a transportation configuration is a propulsion apparatus such as a propeller, turbine engine, rocket engine, or the like. Such an imaging system having a transportation configuration can be realized by mounting the photoelectric conversion apparatus 10 and signal processing apparatus 20 on an automobile, rail car, ship, airplane, satellite, or the like.

Figure 10:
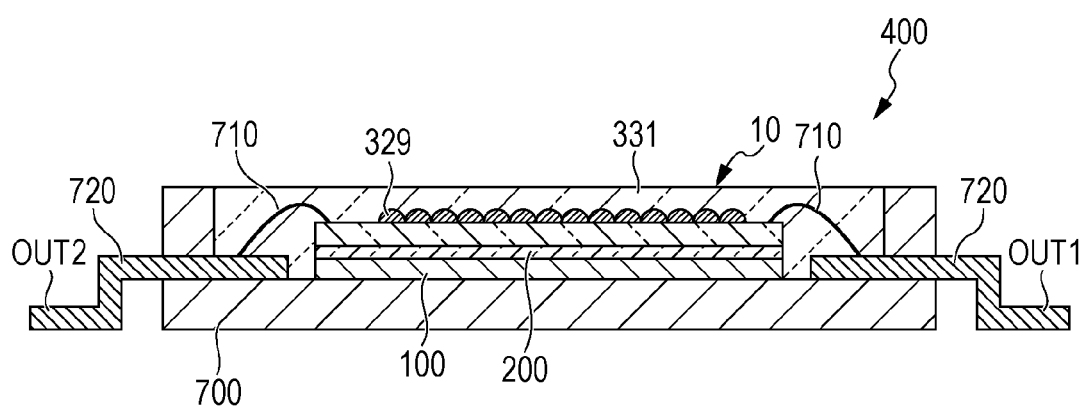
FIG. 10 is a cross-sectional schematic diagram describing an example of a photoelectric conversion apparatus.

An example of the photoelectric conversion apparatus 10 will be described with reference to FIG. 10. According to the present embodiment, the photoelectric conversion apparatus 10 has a package 700, bonding wire 710, lead 720, and sealing layer 331. The lead 720 is the above-described OUT1 and OUT2.

A substrate 100 is fixed to the package 700 via an unshown adhesive (die bonding paste). Ceramics or plastic can be used as the material of the package 700. The substrate 100 is coated with a transparent sealing layer 331. The sealing layer 331 is made of a transparent resin having a refractive index lower than the refractive index of the lens body layer 329 (or the first lens body layer 329). In between the sealing layer 331 and substrate 100, unshown layers are positioned which form a portion of the insulation layer 200 and light condensing member 300. The sealing layer 331 is in contact with the medium 400, and the sealing layer 331 is equivalent to the outermost layer 301 of the light condensing member 300 described with reference to FIG. 1. The sealing layer 331 can protect the substrate 100 from external shocks and soiling. It goes without saying that the sealing layer 331 may be removed from the configuration shown in FIG. 10 (replace the sealing layer 331 with a medium 400), or further, a transparent plate may face the substrate 100 via the medium 400. In this case, the lens body layer 329 (or the first lens body layer 329) in the first through fifth embodiments and the first lens coating layer 330 in the sixth embodiment are equivalent to the outermost layer 301.

Example

Figure 7:
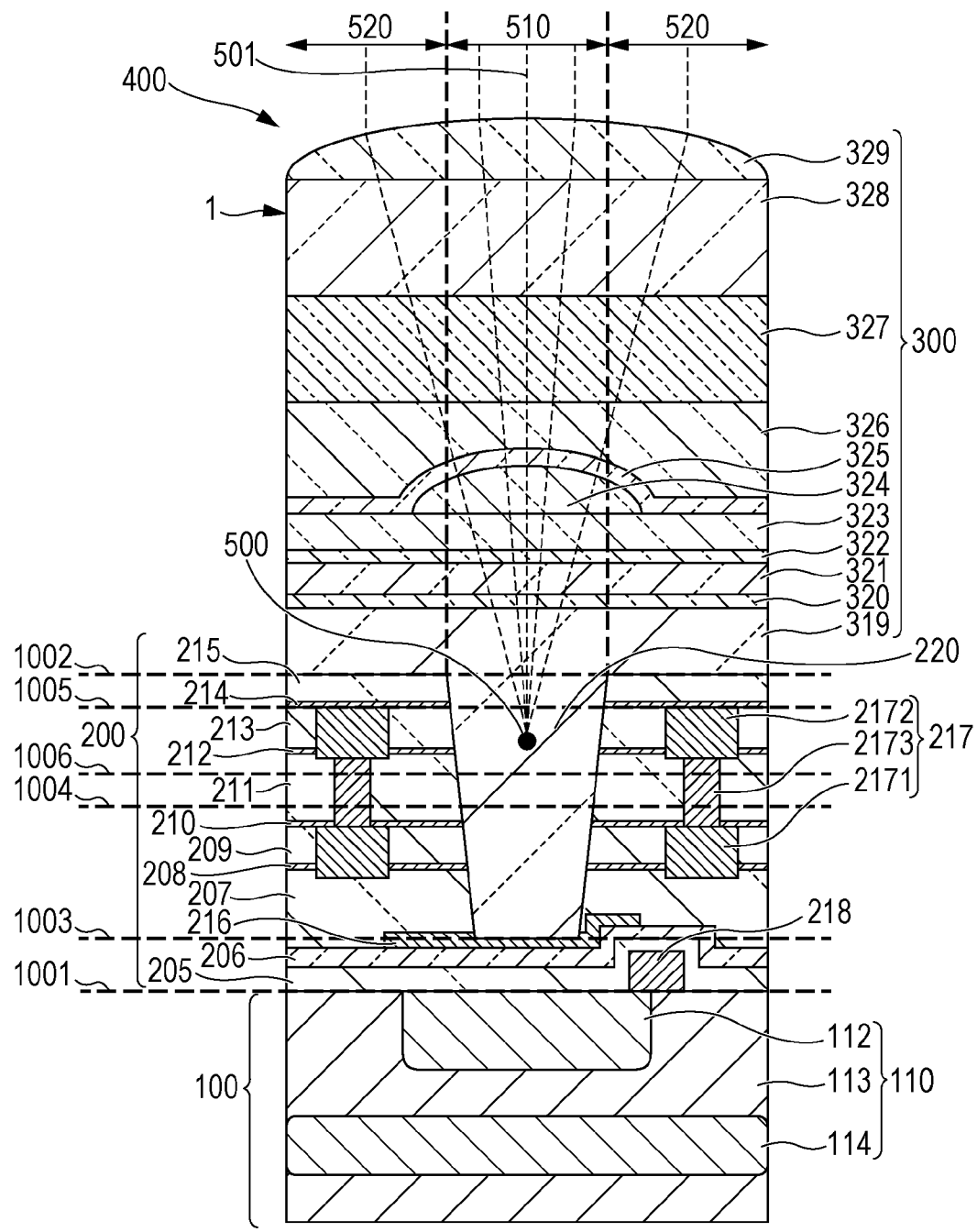
FIG. 7 is a cross-sectional schematic diagram describing a fifth embodiment of the photoelectric conversion element.

Photoelectric conversion elements 1 having a configuration such as that shown in FIG. 7, described as the fifth embodiment, are arrayed two-dimensionally at a spacing of 1.5 μm (arrayed in a grid pattern), thereby creating a photoelectric conversion apparatus 10. The thickness (distance T) of the insulation film 200 is 1.5 μm, and the depth (distance D) of the opening portion 201 is 1.4 μm. Note that first insulation layer 205, fourth insulation layer 208, sixth insulation layer 210, eighth insulation layer 212, and tenth insulation layer 214 all have a thickness of 0.07 μm or less. The diameter of the upper edge of the opening portion 201 is 0.8 μm. The refractive index of the light path member 220 is approximately 1.9. The height of the first lens body layer 329 is 0.5 μm and width is 1.5 μm. The surface is roughly an ideal spherical face. The height of the second lens body layer 324 is 0.27 μm, the thickness of the second lens base layer 323 is 0.23 μm, and the width of the second lens body layer 324 is 1.2 μm. The surface of the second lens body layer 324 is roughly an ideal spherical face. Also, the distance between the tip of the first lens body layer 329 and the tip of the second lens body layer 324 is set at 0.7 μm. Note that the thickness of the first intermediate refractive index layer 322 (silicon oxynitride) is 0.08 μm, the thickness of the low refractive index layer 321 (silicon oxide) is 0.10 μm, the thickness of the second intermediate refractive index layer 320 (silicon oxynitride) is 0.08 μm, and the thickness of the second intermediate layer 319 (silicon nitride) is 0.2 μm. As a result of simulation using FDTD, it is understood that the position of the focal point 500 is formed at a position that is approximately 1.1 μm away from the light receiving face 111 within the light path member 220. A video camera was manufactured using this photoelectric conversion apparatus 10 as an image sensor, whereupon excellent images were obtained. As described above, according to the present invention, the amount of light incident to the light receiving face can be increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-026343, filed Feb. 9, 2011, and Japanese Patent Application No. 2011-223304, filed Oct. 7, 2011, which are hereby incorporated by reference herein in their entirety.

What is claimed is:

1. A photoelectric conversion element comprising:
   a photoelectric conversion portion;
   a light path member arranged within an opening portion of an insulation film, said insulation film having an upper face extending from said opening portion, and said light path member having a lower face in a region corresponding to a light receiving face of said photoelectric conversion portion; and
   a light condensing member including a first layer which is a lens body layer for light condensing, a second layer positioned between said first layer and said light path member, and a third layer positioned between said second layer and said light path member, said third layer having a refractive index that is lower than said second layer; wherein
   said light receiving face is positioned in a first plane and said upper face is positioned in a second plane, said second plane being parallel to said first plane and being away from said first plane by a distance T;
   and wherein said lower face is positioned in a third plane, the third plane being parallel to said first plane and being away from said second plane toward said light receiving face side by a distance D, said distance D being equal to or smaller than said distance T;
   and wherein said light condensing member focuses light, which is incident upon a first area of said light condensing member corresponding to said opening portion, in a region within said light path member, and said region being between said second plane and a fourth plane, said fourth plane being parallel to said first plane and being away from said second plane toward said light receiving face side by a distance D/2.

2. The photoelectric conversion element according to claim 1, further comprising a fourth layer which is positioned between the upper face and the third layer, the fourth layer having a refractive index that is higher than the third layer,
   wherein said light condensing member focuses light, which is incident upon a second area of said light condensing member corresponding to said upper face, in a region within said light path member and between said second plane and said fourth plane.

3. The photoelectric conversion element according to claim 1, wherein said distance D is equal to or greater than a half of said distance T and smaller than said distance T, and said light condensing member focuses light, which is incident to said first area, in a region between a fifth plane and a sixth plane, said fifth plane being parallel to said light receiving face and being away from said second plane toward said light receiving face side by a distance D/8, and said sixth plane being parallel to said light receiving face and being away from said third plane in the opposite direction from said light receiving face by a distance D/8.

4. The photoelectric conversion element according to claim 1, wherein said distance D is 0.55 μm or greater, and the distance T is 10 um or smaller.

5. The photoelectric conversion element according to claim 1, wherein said distance D is 1.0 μm or greater, and width of the opening portion in the second plane is 2.0 um or smaller.

6. The photoelectric conversion element according to claim 1, wherein at least a portion of said light path member has a refractive index that is higher than the refractive index of said insulation film, and wherein said light path member is surrounded by said insulation film and in contact with said insulation film.

7. The photoelectric conversion element according to claim 1, wherein said second layer is a lens body layer for light condensing.

8. A photoelectric conversion apparatus wherein the plurality of photoelectric conversion elements according to claim 7 are arrayed, and a color filter layer is positioned between said first layer and said second layer.

9. An imaging system comprising:
a photoelectric conversion apparatus wherein a plurality of photoelectric conversion elements according to claim 7 are arrayed; and
a signal processing apparatus into which electrical signals output from said photoelectric conversion apparatus are input and which processes said electrical signals.

10. The photoelectric conversion element according to claim 7, further comprising at least one of
a lens coating layer which is provided on said first layer and which has a refractive index lower than the refractive index of said first layer, and
a lens coating layer which is provided on said second layer and which has a refractive index lower than the refractive index of said second layer.

11. The photoelectric conversion element according to claim 1, wherein said light condensing member further includes
a fifth layer which is positioned between said second layer and said third layer and which has a refractive index that is between the refractive index of said second layer and the third layer, and
a sixth layer which is positioned between said light path member and said third layer and which has a refractive index that is between the refractive index of said light path member and the refractive index of said third layer.

12. The photoelectric conversion element according to claim 11, wherein said refractive index of said second layer is greater than the refractive index of said light path member and the refractive index of said fifth layer is greater than the refractive index of said sixth layer.

13. The photoelectric conversion element according to claim 1, wherein said second layer is made of silicon nitride, and said third layer is made of silicon oxide.

14. A photoelectric conversion apparatus wherein the plurality of photoelectric conversion elements according to claim 1 are arrayed, and a color filter layer is positioned between said first layer and said second layer.

15. An imaging system comprising:
a photoelectric conversion apparatus wherein a plurality of photoelectric conversion elements according to claim 1 are arrayed; and
a signal processing apparatus into which electrical signals output from said photoelectric conversion apparatus are input and which processes said electrical signals.

16. The photoelectric conversion element according to claim 1, wherein said light path member is made of silicon nitride, and said third layer is made of silicon oxide.

17. The photoelectric conversion element according to claim 1, wherein a plurality of insulation layers constitutes said insulation film, said plurality of insulation layers including
a first insulation layer that has a refractive index greater than the refractive index of said light path member and that forms a part of side face of said opening portion, and
a second insulation layer that has a refractive index lower than the refractive index of said light path member and that forms a part of said side face, said second insulation layer forming larger area of said side face than said first insulation layer.

18. A photoelectric conversion element comprising:
a photoelectric conversion portion;
a light path member arranged within an opening portion of an insulation film, said insulation film having an upper face extending from said opening portion, and said light path member having a lower face in a region corresponding to a light receiving face of said photoelectric conversion portion; and
a light condensing member including a first lens layer as a light condensing lens body layer, a second lens layer positioned between said first lens layer and said light path member;
at least one of
a lens coating layer which is provided on said first lens layer and which has a refractive index lower than the refractive index of said first lens layer, and
a lens coating layer which is provided on said second lens layer and which has a refractive index lower than the refractive index of said second lens layer;
said light receiving face is positioned in a first plane and said upper face is positioned in a second plane, said second plane being parallel to said first plane and being away from said first plane by a distance T;
and wherein said lower face is positioned in a third plane, the third plane being parallel to said first plane and being away from said second plane toward said light receiving face side by a distance D, said distance D being equal to or smaller than said distance T;
and wherein said light condensing member focuses light, which is incident upon a first area of said light condensing member corresponding to said opening portion, in a region within said light path member, and said region being between said second plane and a fourth plane, said fourth plane being parallel to said first plane and being away from said second plane toward said light receiving face side by a distance D/2.

19. A photoelectric conversion element comprising:
a photoelectric conversion portion;
a light path member arranged within an opening portion of an insulation film, said insulation film having an upper face extending from said opening portion, and said light path member having a lower face in a region corresponding to a light receiving face of said photoelectric conversion portion; and
a light condensing member including at least one light condensing lens body layer; wherein
said light receiving face is positioned in a first plane and said upper face is positioned in a second plane, said second plane being parallel to said first plane and being away from said first plane by a distance T;
and wherein said lower face is positioned in a third plane, the third plane being parallel to said first plane and being away from said second plane toward said light receiving face side by a distance D, said distance D being equal to or smaller than said distance T;
and wherein said light condensing member focuses light, which is incident upon a first area of said light condensing member corresponding to said opening portion, in a region within said light path member, and said region being between said second plane and a fourth plane, said fourth plane being parallel to said first plane and being away from said second plane toward said light receiving face side by a distance D/2,
and wherein at least a portion of said light path member has a refractive index that is higher than the refractive index of said insulation film, and wherein said light path member is surrounded by said insulation film and in contact with said insulation film, and
wherein a plurality of insulation layers constitutes said insulation film, said plurality of insulation layers including
a high refractive index insulation layer that has a refractive index greater than the refractive index of said light path member and that forms a part of a side face of said opening portion, and
a low refractive index insulation layer that has a refractive index lower than the refractive index of said light path member and that forms a part of said side face, said low refractive index insulation layer forming half or more of the area of said side face.

20. The photoelectric conversion element according to claim 19, wherein said light condensing member further includes a first lens layer as the at least one light condensing lens body layer, a second lens layer which is positioned between said first lens layer and said light path member, and a low refractive index layer which is positioned between said second lens layer and said light path member, and which has a refractive index that is lower than the refractive index of said second lens layer.

* * * * *